United States Patent
Korikawa

(10) Patent No.: US 9,591,783 B2
(45) Date of Patent: Mar. 7, 2017

(54) ELECTRONIC DEVICE

(71) Applicant: FUJITSU LIMITED, Kawasaki-shi, Kanagawa (JP)

(72) Inventor: Masayuki Korikawa, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/844,759

(22) Filed: Sep. 3, 2015

(65) Prior Publication Data

US 2016/0135321 A1    May 12, 2016

(30) Foreign Application Priority Data

Nov. 12, 2014  (JP) .................................. 2014-229905

(51) Int. Cl.
*H05K 7/00*  (2006.01)
*H05K 7/14*  (2006.01)
*H05K 5/00*  (2006.01)
*G11B 33/12*  (2006.01)

(52) U.S. Cl.
CPC ......... *H05K 7/1425* (2013.01); *G11B 33/125* (2013.01); *H05K 5/0021* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,243,279 A | * | 1/1981 | Ackeret ............ | B65D 21/0201 108/64 |
| 4,501,460 A | * | 2/1985 | Sisler ...................... | G06F 1/181 361/679.58 |
| 4,558,914 A | * | 12/1985 | Prager .................. | H05K 7/1441 361/679.4 |
| 4,680,674 A | * | 7/1987 | Moore .................. | G06F 1/1615 345/156 |
| 5,227,957 A | * | 7/1993 | Deters ..................... | G06F 1/181 312/223.2 |
| 5,515,239 A | * | 5/1996 | Kamerman .......... | H05K 7/1441 206/509 |
| 5,602,721 A | * | 2/1997 | Slade ........................ | G06F 1/18 206/504 |
| 5,604,662 A | * | 2/1997 | Anderson ............... | G06F 1/184 312/204 |
| 5,808,871 A | * | 9/1998 | Rosecan ................. | G06F 1/181 174/541 |
| 5,909,357 A | * | 6/1999 | Orr ........................... | G06F 1/16 361/679.46 |
| 5,940,274 A | * | 8/1999 | Sato ........................ | G06F 1/181 312/223.2 |
| 5,949,644 A | * | 9/1999 | Park ........................ | G06F 3/033 361/679.32 |

(Continued)

FOREIGN PATENT DOCUMENTS

JP   58-28985   2/1983
JP   3-30482    3/1991

Primary Examiner — Lisa Lea Edmonds
(74) Attorney, Agent, or Firm — Staas & Halsey LLP

(57) ABSTRACT

A rack-mounted electronic device, which is mounted in a rack, includes a housing; a first aperture formed on a first surface of the housing; a first connector configured to protrude from the first aperture; a second aperture formed on a second surface which faces the first surface in the housing; and a second connector arranged in the second aperture.

15 Claims, 40 Drawing Sheets

(56) References Cited

U.S. PATENT DOCUMENTS

| | | | | |
|---|---|---|---|---|
| 6,122,687 A * | 9/2000 | Jung | ............... | G06F 13/4095 |
| | | | | 379/88.13 |
| 6,640,235 B1 * | 10/2003 | Anderson | ............ | G06F 1/184 |
| | | | | 361/679.33 |
| 6,661,648 B2 * | 12/2003 | Dayley | ............... | G06F 1/181 |
| | | | | 361/679.22 |
| 7,099,151 B2 * | 8/2006 | Jones | ............... | H05K 5/0021 |
| | | | | 361/679.02 |
| 7,307,834 B2 * | 12/2007 | Jones | ............... | H05K 5/0021 |
| | | | | 361/679.55 |
| 8,120,922 B2 * | 2/2012 | Randall | ............ | G11B 33/126 |
| | | | | 361/725 |
| 8,169,777 B2 * | 5/2012 | Huang | ............... | G06F 1/181 |
| | | | | 248/223.31 |
| 8,174,824 B2 * | 5/2012 | Westphall | ......... | H05K 7/1425 |
| | | | | 165/104.33 |
| 8,920,185 B2 * | 12/2014 | Pai | ..................... | H01R 13/62 |
| | | | | 361/679.02 |
| 2004/0001320 A1 * | 1/2004 | Baar | ............... | H05K 7/20181 |
| | | | | 361/727 |
| 2005/0219826 A1 * | 10/2005 | Carlson | ............ | G11B 33/128 |
| | | | | 361/724 |
| 2008/0144277 A1 * | 6/2008 | Suzuki | ............... | G06F 1/20 |
| | | | | 361/679.48 |

* cited by examiner

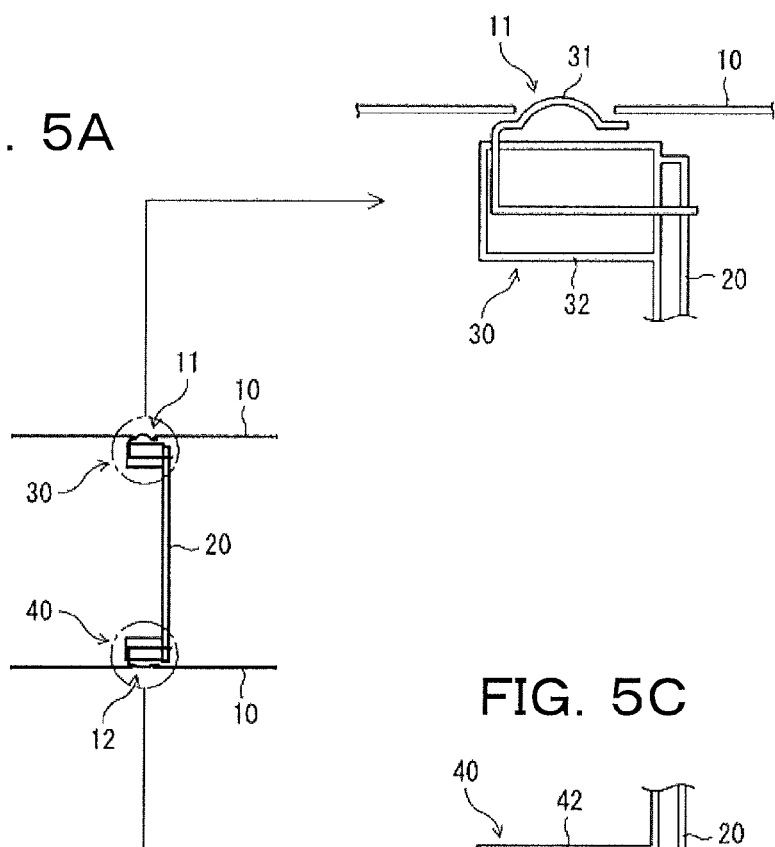

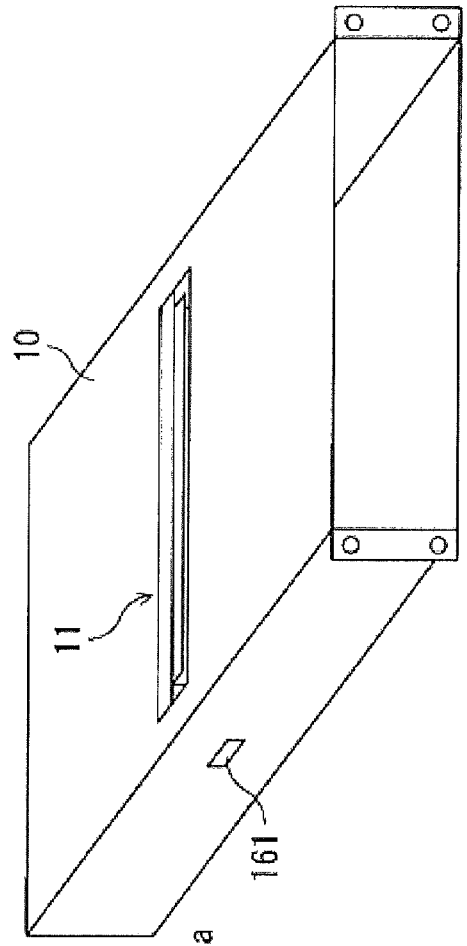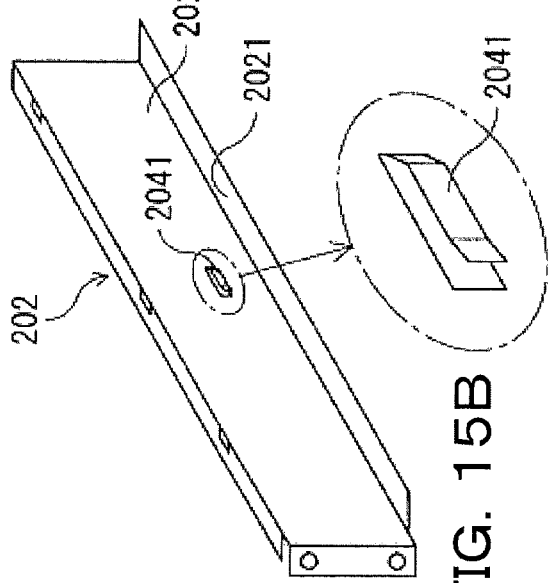

ELECTRONIC DEVICE

CROSS-REFERENCE TO RELATED APPLICATION

This application is based upon and claims the benefit of priority of the prior Japanese Patent Application No. 2014-229905, filed on Nov. 12, 2014, the entire contents of which are incorporated herein by reference.

FIELD

The embodiment discussed herein is related to, for example, a rack-mounted electronic device.

BACKGROUND

A rack-mounted system, in which electronic devices are mounted in a prescribed sized rack, is known.

FIGS. 40A and 40B are views illustrating the appearance of a rack-mounted system according to the related art. FIG. 40A is a view illustrating the front surface thereof and FIG. 40B is a view illustrating the back surface thereof.

A rack-mounted system 500, which is illustrated in FIGS. 40A and 40B, includes a plurality of (two in an example illustrated in FIGS. 40A and 40B) storage systems 550 in a rack 510. Each of the storage systems 550 includes a plurality of electronic devices such as drive enclosures (DEs: storage device) 501 and controller enclosures (CEs: storage control device) 502. Each of the DEs 501 and CEs 502 are provided to be detachable from the rack 510.

The DE 501 is equipped with a storage device, such as a hard disk drive (HDD), and provides the storage area of the storage device to the storage system 550.

The CE 502 is a control device which controls the operation of the storage systems 550, and includes controller modules (CM) 503 (refer to FIG. 40B). The CMs 503 perform various types of control, such as access control to the storage devices of the DE 501, according to an I/O command which is transmitted from a host device which is not illustrated in the drawing.

The rack 510 includes a plurality of stages of mounting areas (not illustrated in the drawing), and it is possible to arbitrarily mount the DEs 501 and the CEs 502 in the mounting areas. For example, when the DEs 501 are mounted in the rack 510, it is possible to increase the storage capacity of the storage systems 550.

In the example illustrated in FIG. 40A, eighteen DEs 501 and two CEs 502 are inserted into the rack 510.

In addition, as illustrated in FIG. 40B, each of the DEs 501 and the CEs 502 are connected to other DEs 501 and CEs 502, which are mounted in adjacent mounting areas in the vertical direction in the rack 510, through inter-unit cables 521.

More specifically, connectors (apertures), which are capable of inserting the connectors (not illustrated in the drawing) of the inter-unit cables 521, are formed on the back surfaces of the respective DEs 501 and the CEs 502, and thus the connections between the DE 501 and the DE 501 and between the DE 501 and the CE 502, which are adjacent in the vertical direction, are performed by inserting the connectors of the inter-unit cables 521 into the respective connectors. Therefore, cascade connection is performed between the plurality of DEs 501 and CEs 502 which are mounted in the rack 510.

In addition, as illustrated in FIG. 40B, the DEs 501 and the CEs 502 are connected to power supply devices, which are not illustrated in the drawing, through respective power supply cables. In addition, the respective CEs 502 are connected to host devices or the like, which are not illustrated in the drawing, through communication cables.

For example, Japanese Examined Utility Model Registration Application Publication No. 62-135 and Japanese Unexamined Utility Model Registration Application Publication No. 3-30482 are examples of the related art.

SUMMARY

In accordance with an aspect of the embodiments, a rack-mounted electronic device, which is mounted in a rack, includes a housing; a first aperture formed on a first surface of the housing; a first connector configured to protrude from the first aperture; a second aperture formed on a second surface which faces the first surface in the housing; and a second connector arranged in the second aperture.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which:

FIGS. 5A, 5B, and 5C are side sectional views illustrating the configurations of a first connector and a second connector in the electronic device as the example according to the embodiment;

FIGS. 15A, 15B, and 15C are views illustrating the position determining structure of the mounting clamp in which the electronic device as the example according to the embodiment is mounted;

DESCRIPTION OF EMBODIMENT

Figure 1:
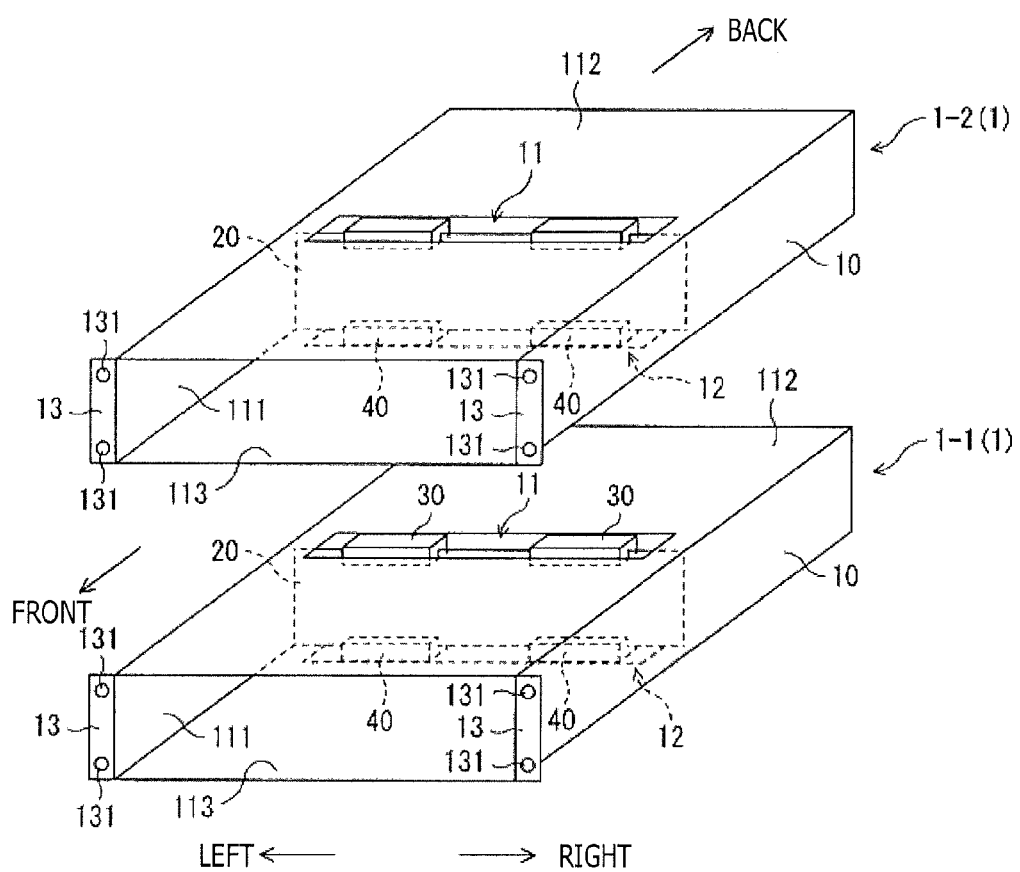
FIG. 1 is a perspective view schematically illustrating the configuration of an electronic device as an example according to an embodiment.

Hereinafter, embodiment of an electronic device will be described with reference to the accompanying drawings. However, the embodiment described hereinafter is only examples and do not intend to exclude various modification examples or technical applications which are not described in the embodiment. That is, it is possible to realize the embodiment through various modifications (combinations of the embodiment and respective modification examples) without departing from the gist thereof. In addition, it is possible to include not only the components which are illustrated in the drawings but also other functions and the like.

(A) Connector Connection

FIG. 1 is a perspective view schematically illustrating the configuration of an electronic device 1 as an example of an embodiment.

In FIG. 1, two electronic devices 1-1 and 1-2 are vertically arranged. Meanwhile, hereinafter, reference numerals 1-1 and 1-2 are used when it is desired to specify one of a plurality of electronic devices as reference numerals which indicate the electronic devices. However, when an arbitrary electronic device is indicated, reference numeral 1 is used.

Figure 2:
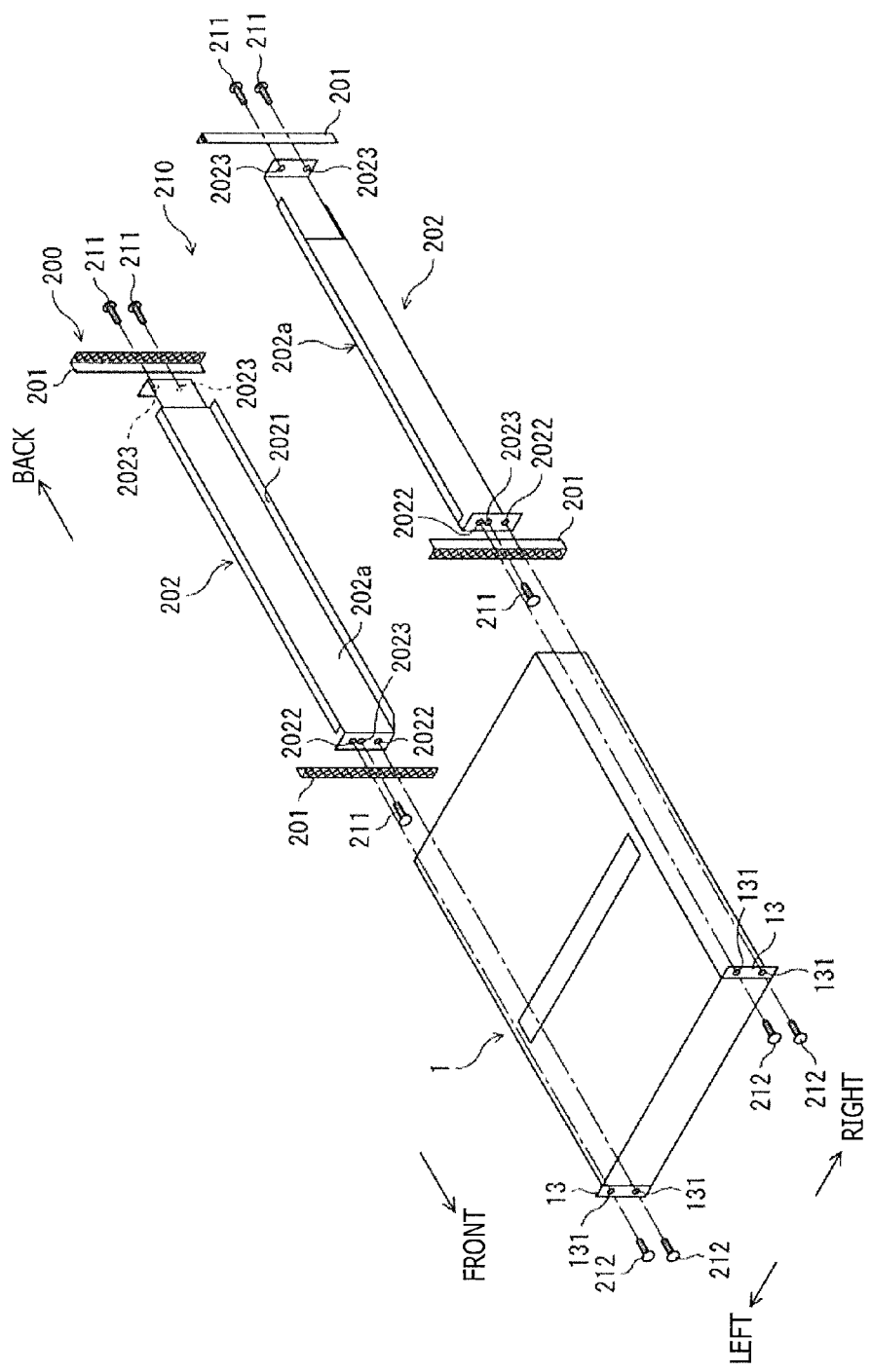
FIG. 2 is a perspective view illustrating a method of attaching the electronic device as the example according to the embodiment to a rack.

The electronic device 1 is a rack-mounted electronic device which is used by being mounted on a rack 200 (only a part, such as a support 201, thereof is illustrated in FIG. 2). In the rack 200, a plurality of mounting areas 210, in which the electronic devices 1 are mounted, are formed, for example, in the vertical direction. An arbitrary number of electronic devices 1 are mounted in the rack 200 by mounting the electronic devices 1 in the respective mounting areas 210. Hereinafter, there is a case in which the mounting area 210 of the electronic device 1 in the rack 200 is called a slot 210.

In addition, when the plurality of electronic devices 1 are mounted on the rack 200, the plurality of electronic devices 1 are mounted such that the electronic devices 1 are vertically adjacent to each other and such that the slots 210, in which the electronic devices 1 are not mount and which are empty spaces, are not positioned between the electronic devices 1.

Meanwhile, in the example illustrated in FIG. 1, for convenience, the electronic device 1-1 and the electronic device 1-2 are illustrated while being separately arranged.

FIG. 2 is a perspective view illustrating a method of attaching the electronic device 1 to the rack 200. The rack 200 includes four established supports 201, and two supports 201, which are arranged along the front and back direction of the rack 200, are connected to each other using a rectangular-shaped mounting clamp 202.

The front and back direction in the rack 200 corresponds to a direction in which the electronic device 1 is inserted to or extracted from the slot 210 of the rack 200, and it is assumed that a side, to which the electronic device 1 is inserted, in the slot 210 is a front side. In addition, there is a case in which a direction on a plane surface, which is perpendicular to the front and back direction, is called a left and right direction.

The front end part and the back end part of the mounting clamp 202 are respectively curved in L-shapes in the left and right direction, and one or more fixing holes 2023 are formed at each of the curved parts. In the example illustrated in FIG. 2, two fixing holes 2023 are vertically formed at the back end part, and one fixing hole 2023 is formed at the front end part.

In addition, at the front end part of the mounting clamp 202, one or more fixing holes 2022 are vertically formed with the fixing hole 2023. In the example illustrated in FIG. 2, two fixing holes 2022 are formed while interposing the fixing hole 2023 therebetween.

Screws 211 are inserted into some of a plurality of holes, which are formed in the supports 201 along the vertical direction, so as to penetrate the holes, and the screws 211 are screwed into the fixing holes 2023. Therefore, the supports 201 are fixed to the mounting clamps 202.

Here, in the rack 200, a space between the pair of mounting clamps 202, which are arranged in the horizontal direction (left and right direction) in parallel, functions as the slot 210 to which the electronic device 1 is inserted. The mounting clamps 202 form the side walls of the slot 210.

In addition, the lower end of the mounting clamp 202 is curved in an L shape so as to be horizontal with the inside of the slot 210, thereby functioning as a support section 2021 that supports the electronic device 1 which is inserted into the slot 210.

A surface on a side, in which the support section 2021 protrudes, in the mounting clamp 202 becomes the inner wall surface of the slot 210. Hereinafter, there is a case in which the surface on the side, in which the support section 2021 protrudes, in the mounting clamp 202, that is, a surface which is the inner wall surface of the slot 210 is called an inner wall surface 202a.

The electronic device 1 includes a housing 10 and a rectangular mid-plane MP 20 in the housing 10.

In the front side of the housing 10, rack fixing sections 13 are formed to fix the housing 10 to the supports 201 of the rack 200.

The rack fixing sections 13 are plate members which are formed on the front surface of the housing 10 and protrude in the left and right directions along the front surface. The rack fixing sections 13 come into contact with the supports 201 of the rack 200 when the electronic device 1 is inserted into the slot 210 of the rack 200. Therefore, the position of the electronic device 1 in the rack 200 is determined.

In addition, attachment holes 131 are formed in the rack fixing sections 13 along longitudinal directions. In the state in which the electronic device 1 is inserted into the slot 210 of the rack 200 and the rack fixing sections 13 come into contact with the supports 201 of the rack 200, screws 212 are inserted such that the screws 212 penetrate the attachment holes 131 and the holes which are formed in the supports 201, thereby being screwed to the fixing holes 2022 of the mounting clamps 202. Therefore, the electronic device 1 is fixed to the supports 201.

The MP 20 is a circuit board unit and is established in the middle of the housing 10 to divide the space in the housing 10 into front and rear sections.

Figure 3:
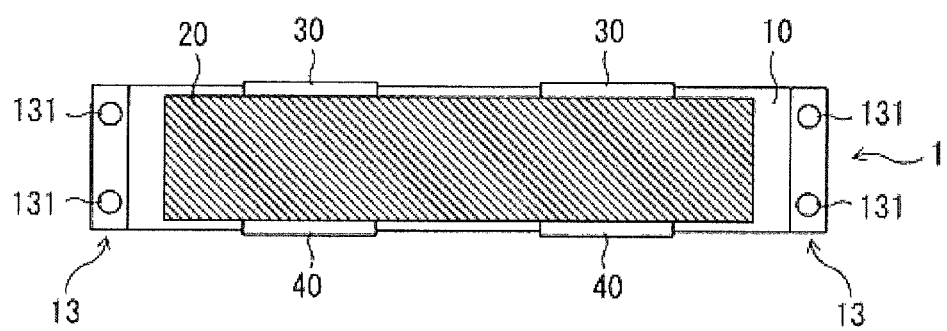
FIG. 3 is a view schematically illustrating the configuration of the MP of the electronic device as the example according to the embodiment.

FIG. 3 is a view schematically illustrating the configuration of the MP 20 of the electronic device 1 as the example according to the embodiment, and illustrates a state viewed from the front of the housing 10.

One or more (two in the example illustrated in FIG. 3) first connectors 30 are arranged on the upper side of the MP 20 in the longitudinal direction. In addition, second connectors 40, of which the number (two in the example illustrated in FIG. 3) is the same as the number of the first connectors 30, are arranged on the lower side of the MP 20 in the longitudinal direction at respective positions which face the first connectors 30.

In addition, as illustrated in FIG. 1, an aperture (first aperture) 11 is formed at a position, which faces the MP 20, on the upper surface (top plate 112: first surface) of the housing 10, and the first connectors 30 are exposed through the aperture 11. Similarly, an aperture (second aperture) 12 is formed at a position, which faces the MP 20, on the lower surface (bottom plate 113: second surface) of the housing 10, and the second connectors 40 are exposed through the aperture 12.

In a state in which the electronic device 1 is inserted into the slot 210 of the rack 200, the first connectors 30 come into contact with the second connectors 40 of another adjacent electronic device 1, which is inserted to an upper-side slot 210 of the slot 210, in the rack 200. Therefore, the first connectors 30 of one electronic device 1 (for example, electronic device 1-1) are electrically connected to the second connectors 40 of another electronic device 1 (for example, electronic device 1-2) which is positioned on the upper side of the one electronic device 1.

Hereinafter, there is a case in which, when the electronic device 1 is inserted into the slot 210, the electrical connection between the first connectors 30 of one electronic device 1 and the second connectors 40 of another electronic device 1 is called connector connection.

Meanwhile, in the respective electronic devices 1, the MPs 20 are attached to the same positions in the housings 10, and the apertures 11 and 12 are formed at the same positions of the housings 10 in the respective electronic devices 1.

Figure 4:
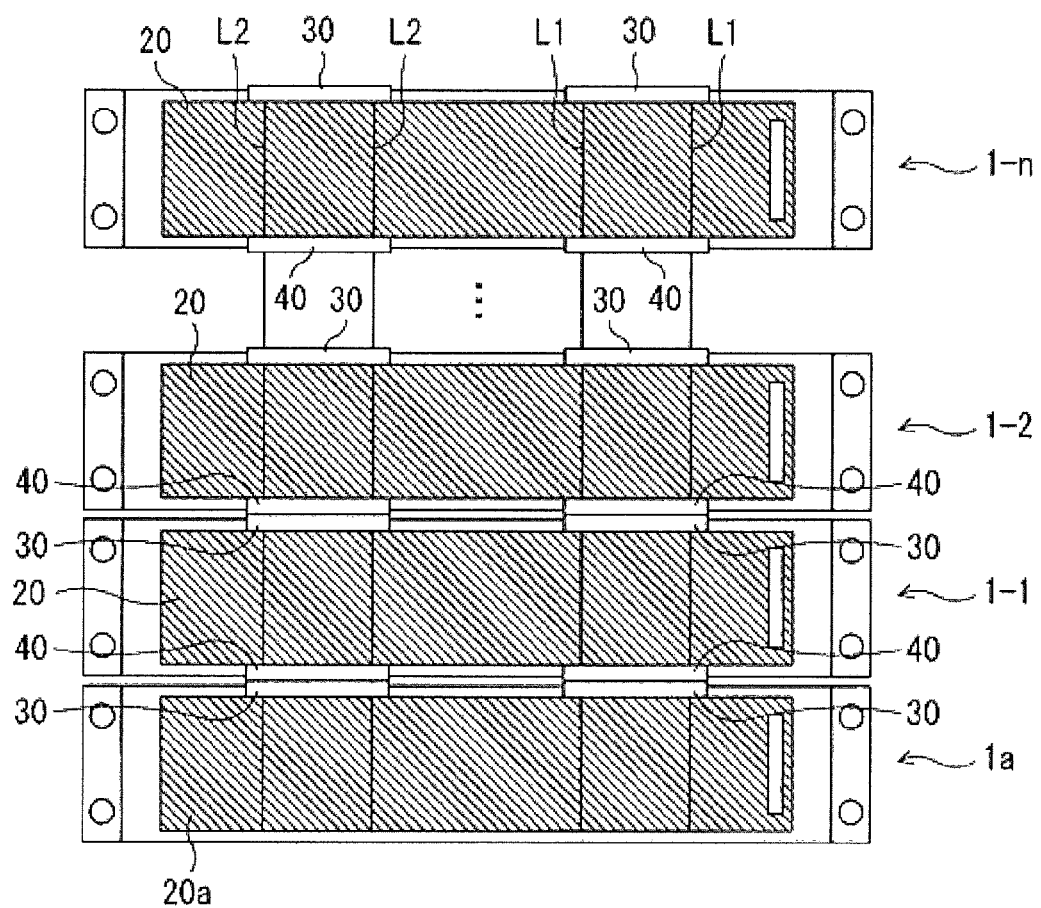
FIG. 4 is a view illustrating a state in which MPs are connected in a state in which the racks of the electronic device as the example according to the embodiment are mounted.

FIG. 4 is a view illustrating a state in which the MPs 20 are connected in a state in which the racks of the electronic device 1 as the example according to the embodiment are mounted. The example illustrated in FIG. 4 illustrates a state in which n (n is a natural number which is 2 or greater) electronic devices 1 are mounted in the rack 200, and, for example, the first connectors 30 of the electronic device 1-1 come into contact with the second connectors 40 of the electronic device 1-2 which is positioned on the upper side of the electronic device 1-1.

Meanwhile, in FIG. 4, the state, in which the MPs 20 of the respective electronic devices 1 are electrically connected to each other through the first connectors 30 and the second connectors 40, is expressed as an image using solid lines L1 and L2. In the example illustrated in FIG. 4, redundancy is performed by a first electric connection system which is expressed by the solid lines L1 on the right side of the drawing, and a second electric connection system which is expressed by the solid lines L2 on the left side of the drawing.

In addition, in FIG. 4, an electronic device 1a is arranged under the electronic device 1-1, that is, at the bottom. The electronic device 1a is, for example, a CE, and includes a CM which is not illustrated in the drawing. Generally, in the storage device, the CE is attached to a top end position or a bottom end position in the rack 200.

In addition, the electronic device is includes an MP 20a instead of the MP 20 of the electronic device 1.

The MP 20a has the same configuration as in the electronic device 1 other than the second connectors 40 are removed from the MP 20, and thus the detailed description thereof will not be repeated.

FIGS. 5A, 5B, and 5C are side sectional views illustrating the configurations of the first connector 30 and the second connector 40 in the electronic device 1 as the example according to the embodiment. FIG. 5A is a side view illustrating the MP 20, FIG. 5B is a side sectional view illustrating the first connector 30, and FIG. 5C is a side sectional view illustrating the second connector 40.

Figure 6A:
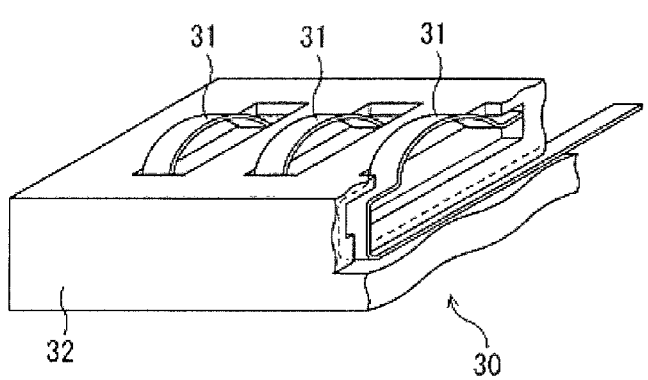
FIGS. 6A and 6B are perspective views illustrating the configurations of the first connector and the second connector in the electronic device as the example according to the embodiment.
Figure 6B:
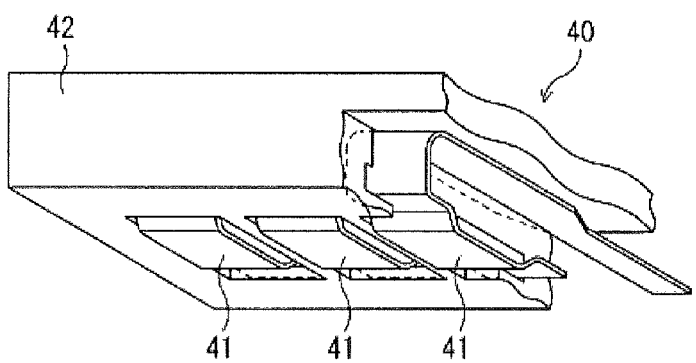

In addition, FIGS. 6A and 6B are perspective views illustrating the configurations of the first connector 30 and the second connector 40 in the electronic device 1 as the example according to the embodiment. FIG. 6A illustrates the first connector 30 and FIG. 6B illustrates the second connector 40, respectively.

As illustrated in FIG. 6A, the first connector 30 includes contact clamps 31 and a case 32. The case 32 is fixed to the upper end position of the MP 20 and the plate-shaped contact clamps 31 protrude from the upper surface of the upper surface of the case 32 in a state in which the parts of the contact clamps are curved into circular arc shapes.

Meanwhile, in the example illustrated in FIG. 6A, a part of the case 32 is cut off such that the shapes of the contact clamps 31 are seen. In addition, in FIG. 6A, three contact clamps 31 are illustrated in the drawing. However, the number of contact clamps is not limited thereto. The first connector 30 may include two or less or four or more contact clamps 31 and implementation through various modifications is possible.

As illustrated in FIG. 5B, the contact clamp 31 of the first connector 30 protrudes through the aperture 11 which is formed in the housing 10.

As illustrated in FIG. 6B, the second connector 40 includes a contact clamp 41 and a case 42. The case 42 is fixed to the bottom end position of the MP 20, and the plate-shaped contact clamp 41 protrudes from the lower surface of the case 42 in a state in which a part of the contact clamp 41 is curved in a convex.

As illustrated in FIG. 5C, the contact clamp 41 of the second connector 40 protrudes through an aperture 12 which is formed in the housing 10. Meanwhile, in the example illustrated in FIG. 5C, the contact clamp 41 which protrudes through the aperture 12 is flush with the housing 10.

Meanwhile, in the example illustrated in FIG. 6B, a part of the case 42 is cut off such that the shapes of the contact clamps 41 are seen. In addition, in FIG. 6B, three contact clamps 41 are illustrated in the drawing. However, the number of contact clamps is not limited thereto. The second connector 40 may include two or less or four or more contact clamps 41 and implementation through various modifications is possible.

Figure 7:
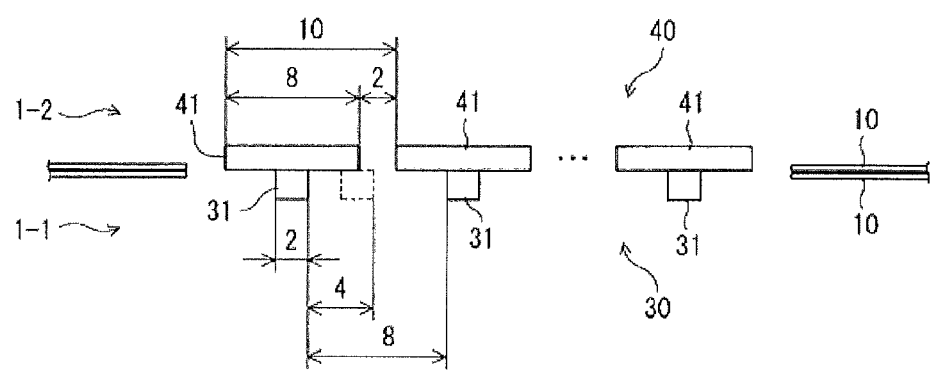
FIG. 7 is a view illustrating the positional relationship between the contact clamp of the first connector and the contact clamp of the second connector in the electronic device as the example according to the embodiment.

FIG. 7 is a view illustrating the positional relationship between the contact clamp 31 of the first connector 30 and the contact clamp 41 of the second connector 40 in the electronic device 1 as the example according to the embodiment.

FIG. 7 illustrates a state in which the second connector 40 of the electronic device 1-2 is connector connected to the first connector 30 of the electronic device 1-1. As illustrated in FIG. 7, the contact clamps 31 of the first connector 30 and the contact clamps 41 of the second connector 40 are provided at positions, which correspond to each other, so as to be connected one to one in a state in which connector connection is performed.

In the example illustrated in FIG. 7, the width dimension of the contact clamp 41 is 8 mm, and the distance between adjacent contact clamps 41 is 2 mm. In contrast, the width dimension of the contact clamp 31 is 2 mm, and the distance between adjacent contact clamps 31 is 8 mm. Therefore, as illustrated using a dotted line in the drawing, even when the contact clamp 31 is deviated by approximately 4 mm from the contact clamp 41 in the left and right direction in the drawing, it is possible to implement the connector connection. For example, in a general rack-mounted storage device, the width of the device is manufactured with a precision of approximately ±2 mm. With such a configuration, connector connection is securely performed, and thus it is possible to secure product performance.

That is, the contact clamp 31 is smaller than the contact clamp 41, and the distance between the contact clamps 31 is larger than that of the contact clamp 41, and thus it is possible to adsorb the errors of the device size or the mounting position of the electronic device.

A method of connecting the connectors in the electronic device 1, which is configured as described above, as the example according to the embodiment will be described with reference to FIGS. 8A, 8B, and 8C. Meanwhile, an example illustrated in FIGS. 8A, 8B, and 8C illustrates a case in which, in a state in which the electronic device 1-2 is mounted in the rack 200, the electronic device 1-1 is inserted into the slot 210 above the electronic device 1-2.

Figure 8A:
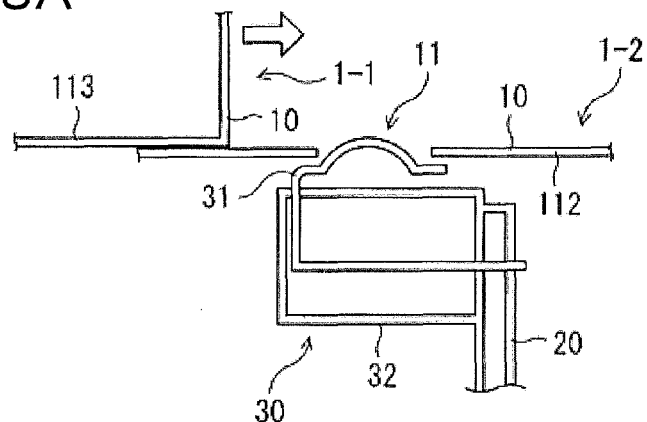
FIGS. 8A, 8B, and 8C are views illustrating a method of connecting the connectors in the electronic device as the example according to the embodiment.

In a state before the electronic device 1-1 is inserted, the contact clamp 31 of the first connector 30 protrudes from the aperture 11 on the upper surface (top plate 112) of the housing 10 of the electronic device 1-2, as illustrated in FIG. 8A.

Figure 8B:
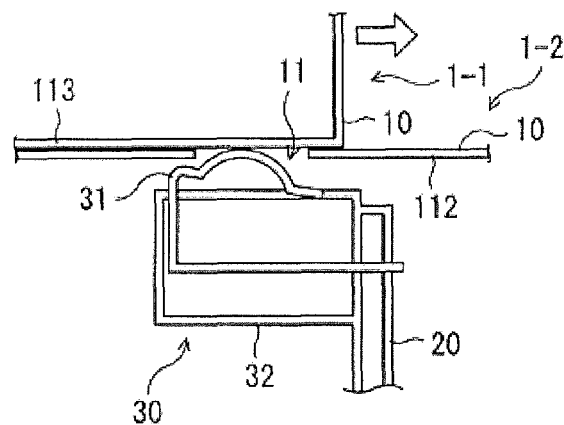

As illustrated in FIG. 8B, when the electronic device 1-1 is inserted into the slot 210, the bottom surface (bottom plate 113) of the housing 10 of the electronic device 1-1 comes into contact with the contact clamp 31 of the electronic device 1-2, and the contact clamp 31 is pushed into the housing 10 of the electronic device 1-2.

Figure 8C:
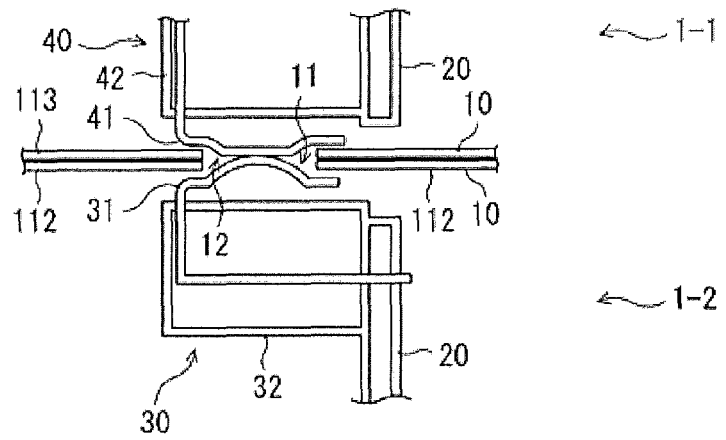

Further, when the electronic device 1-1 is inserted into the slot 210, the contact clamp 31 of the first connector 30 of the electronic device 1-2 protrudes through the aperture 12 of the electronic device 1-1 and the aperture 11 of the electronic device 1-2, and comes into contact with the contact clamp 41 of the second connector 40 of the electronic device 1-1, as illustrated in FIG. 8C. Therefore, connector connection is implemented between the electronic device 1-1 and the electronic device 1-2.

When the contact clamps 31 and the contact clamps 41 come into contact with the housings 10 of the electronic device 1-1 and the electronic device 1-2 in the middle stage of the insertion, there is a problem in that a trouble occurs because contact clamps in the first connectors 30 and the second connectors 40 are short-circuited. In such a case, a problem may be dealt with by attaching an insulation sheet to the surface of the housings 10 of the electronic device 1-1 and the electronic device 1-2 or performing the insulation process.

Figure 9:
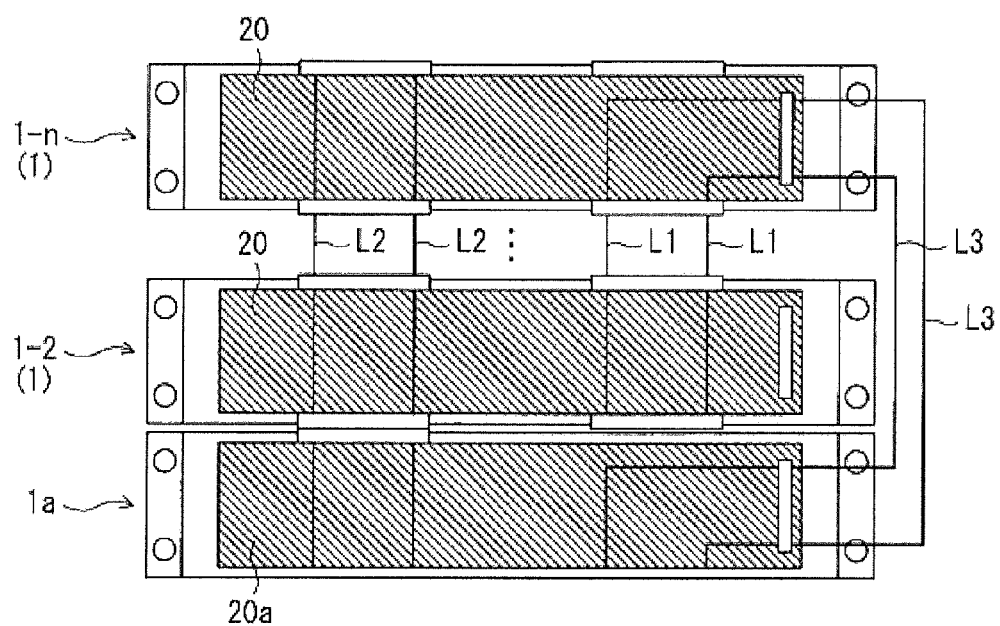
FIG. 9 is a view illustrating another example of the state in which the MPs are connected in the state in which the racks of the electronic device as the example according to the embodiment are mounted.

FIG. 9 is a view illustrating another example of a state in which the MPs 20 are connected in the state in which the rack 200 is mounted in the electronic device 1 as the example according to the embodiment.

In the connection state illustrated in FIG. 4, redundancy is performed by the two electric connection systems (paths) which are indicated by the solid lines L1 and L2. However, when connection in the electronic device 1 is cut because a failure occurs in any electronic device 1 or when the electronic device 1 is separated from the rack 200 for exchange, subsequent parts are disconnected from the electronic device 1a.

Here, in the example illustrated in FIG. 9, in one of the electric connection systems (the electric connection system connected through the solid line L1 in the example), so-called reverse connection (reverse cabling), in which an electronic device 1-n, which is positioned at the top, and the electronic device 1a, which is positioned at the bottom, are connected using cables L3, is performed. Meanwhile, in order to implement the reverse connection, the MPs 20 and 20a of the electronic devices 1 and is include connectors for connecting the cables L3.

Therefore, when a failure occurs in the electronic device 1 on the path, continuous access from a normal path is possible through the cables L3. Therefore, it is possible to suppress influenced sections to the minimum, and it is possible to improve the reliability. In such a connection configuration, it is possible to use connector connection by the first connectors 30 and the second connectors 40 for connection from the electronic device 1-2 to the electronic device 1-n by the solid lines L1 and connection from the electronic device is to the electronic device 1-n by the solid lines L2.

(B) Position DE Terming Structure

In the electronic device 1, it is preferable to have a position determining structure between the housings 10 in order to securely perform connector connection with another electronic device 1 in the rack 200. When the position determining structure between the housings 10 is provided, it is possible to reduce the respective dimensions illustrated in FIG. 7 in accordance with the accuracy of the position determining structure, and thus it is possible to reduce the sizes of the connectors and to increase the number of connection signals. Here, the electronic device 1 has a position determining structure between the housings 10.

Hereinafter, the position determining structure will be described in (B-1) to (B-3). The electronic device 1 includes at least one of the position determining structures described in (B-1) to (B-3).

(B-1) First Example of Position Determining Structure

Figure 10:
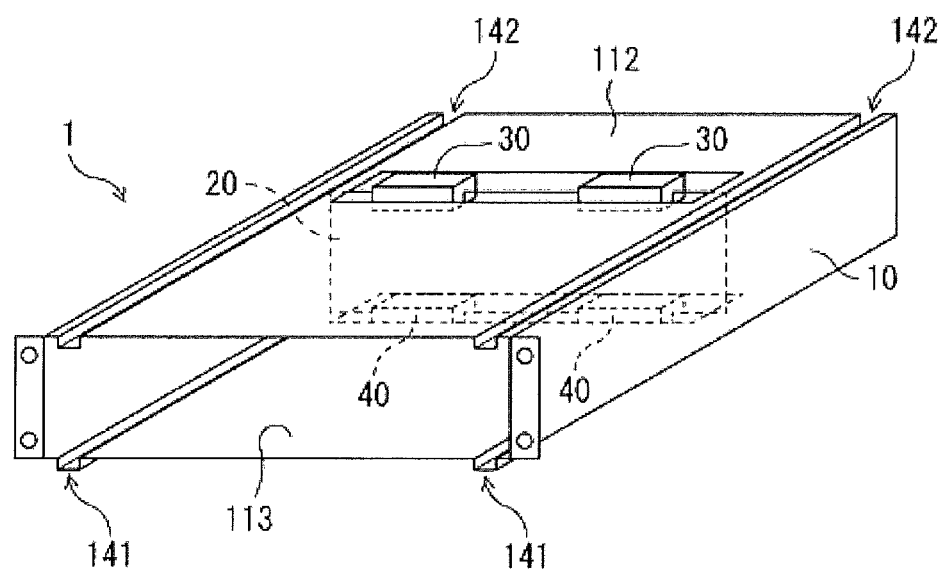
FIG. 10 is a view illustrating a position determining structure in the electronic device as the example according to the embodiment.

FIG. 10 is a view illustrating a position determining structure in the electronic device 1 as the example according to the embodiment. In an example illustrated in FIG. 10, in the vicinity of both ends of the lower surface (bottom plate 113) of the housing 10 in the left and right direction, rail-shaped position-determining protrusion parts 141 are provided along the direction in which the electronic device 1 is inserted into or extracted from the rack 200, that is, the front and back direction. In addition, on the upper surface (top plate 112) of the housing 10, guide grooves 142 are formed along the direction in which the electronic device 1 is inserted into or extracted from the rack 200, that is, the front and back direction.

Configuration is made such that it is possible to fit the position-determining protrusion parts 141 to the guide grooves 142. When electronic devices 1 are mounted in the rack 200, the position-determining protrusion parts 141 of an electronic device 1 inserted into an upward slot 210 are guided after being fitted to the guide grooves 142 of an electronic device 1 at a lower-side slot 210.

Therefore, position determining is performed between the electronic devices 1, which are vertically positioned in the rack 200, in the left and right direction, and thus it is possible to securely perform connector connection.

Meanwhile, the number of position-determining protrusion parts 141 and guide grooves 142, which are provided in the housing 10 of the electronic device 1, is not limited to two which are illustrated in FIG. 10. That is, one or three or more position-determining protrusion parts 141 and guide grooves 142 may be formed in the housing 10. In addition, implementation is possible through various modifications such that the position-determining protrusion parts 141 are formed on the top plate 112 and the guide grooves 142 are formed on the bottom plate 113.

(B-2) Second Example of Position Determining Structure

Figure 11:
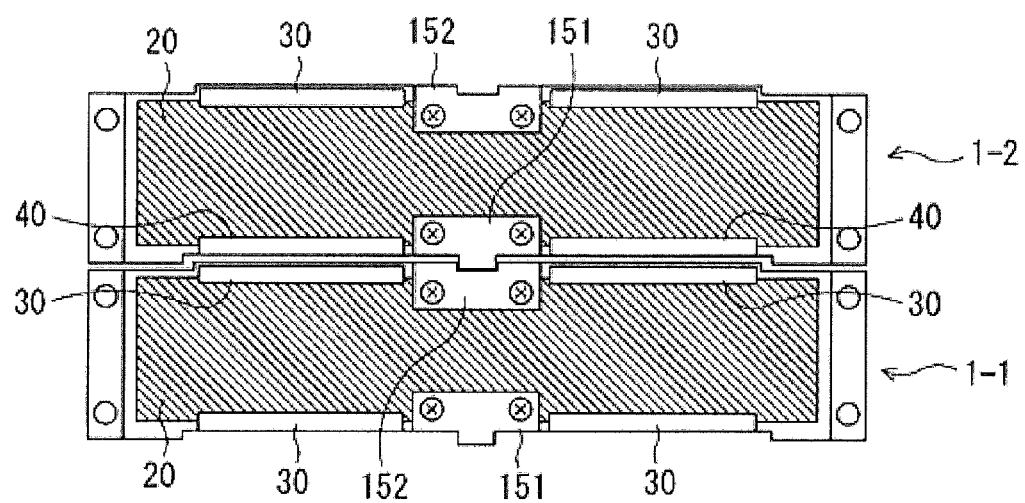
FIG. 11 is a view illustrating another position determining structure in the electronic device as the example according to the embodiment.
Figure 12A:
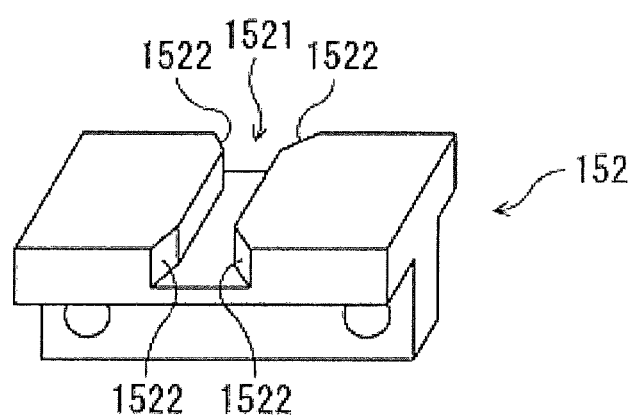
FIGS. 12A and 12B are views illustrating another position determining structure in the electronic device as the example according to the embodiment.
Figure 12B:
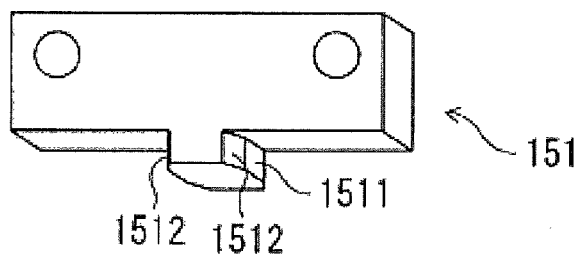

FIG. 11 and FIGS. 12A and 12B are views illustrating other position determining structures in the electronic device 1 as the example according to the embodiment. FIG. 11 is a view illustrating the MP20 which includes a position-determining protrusion clamp 151 and a position determining recessed clamp 152. In addition, FIG. 12A is a perspective view illustrating the position determining recessed clamp 152 and FIG. 12B is a perspective view illustrating the position-determining protrusion clamp 151.

The MP 20 illustrated in FIG. 11 includes one or more (one in an example illustrated in FIG. 11) position determining recessed clamps 152 on the upper side of the longitudinal direction and one or more (one in an example illustrated in FIG. 11) position-determining protrusion clamps 151 on the lower side of the longitudinal direction.

Meanwhile, in an example illustrated in FIG. 11, the position determining recessed clamp 152 is provided on the upper-side central position of the MP 20 in the longitudinal direction, and the position-determining protrusion clamp 151 is provided on the lower-side central position of the MP 20 in the longitudinal direction at a position which faces the position determining recessed clamp 152.

As illustrated in FIG. 12B, the position-determining protrusion clamp 151 includes a position-determining protrusion part 1511. The position-determining protrusion part 1511 protrudes from the aperture 12, which is formed on the lower surface of the housing 10, in a state in which the MP 20, to which the position-determining protrusion clamp 151 is attached, is arranged in the housing 10.

The position-determining protrusion part 1511 has a rectangular parallelepiped shape, and is extended along the direction in which the electronic device 1 is inserted into or extracted from the rack 200, that is, the front and back direction in the vicinity of the center of the lower surface of the housing 10.

In addition, slop sections 1512 are formed at the respective corners of the position-determining protrusion part 1511 in the front and back direction by performing chamfering. The slop sections 1512 come into contact with the sideway surfaces 1522 of the position determining recessed clamp 152, which will be described later, thereby operating such that the position-determining protrusion part 1511 is guided through the guide groove 1521 of the position determining recessed clamp 152.

As illustrated in FIG. 12A, the guide groove 1521 is formed in the position determining recessed clamp 152 along the direction in which the electronic device 1 is inserted into or extracted from the rack 200, that is, the front and back direction.

Configuration is made such that it is possible to fit the position-determining protrusion part 1511 of the position-determining protrusion clamp 151 to the guide groove 1521. When the electronic devices 1 are mounted in the rack 200, the position-determining protrusion part 1511 of the position-determining protrusion clamp 151 of the electronic device 1 inserted into the upward slot 210 is guided after being fitted to the guide groove 1521 of the position determining recessed clamp 152 of the electronic device 1 at the lower-side slot 210. Therefore, position determining is performed between the electronic devices 1, which are vertically positioned in the rack 200, and thus it is possible to securely perform connector connection.

In addition, the sideway surfaces 1522, which face end parts, are formed at the respective end parts of the guide groove 1521 in the front and back direction so as to widen the width of the guide groove 1521. The sideway surfaces 1522 come into contact with the slop sections 1512 of the position-determining protrusion clamp 151, which is described above, thereby operating such that the position-determining protrusion part 1511 is guided through the guide groove 1521 of the position determining recessed clamp 152.

(B-3) Third Example of Position Determining Structure

A third example of the position determining structure includes a position determining structure between the mounting clamps 202 and a position determining structure of the electronic device 1 for the mounting clamps 202 on which the position determining is determined.

Figures 13A, 13B:
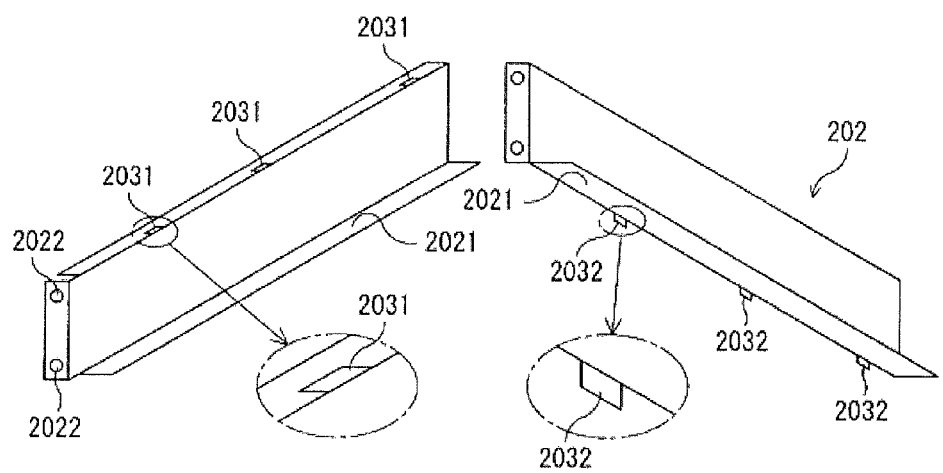
FIGS. 13A and 13B are views illustrating a position determining structure of a mounting clamp in which the electronic device as the example according to the embodiment is mounted.
Figure 14:
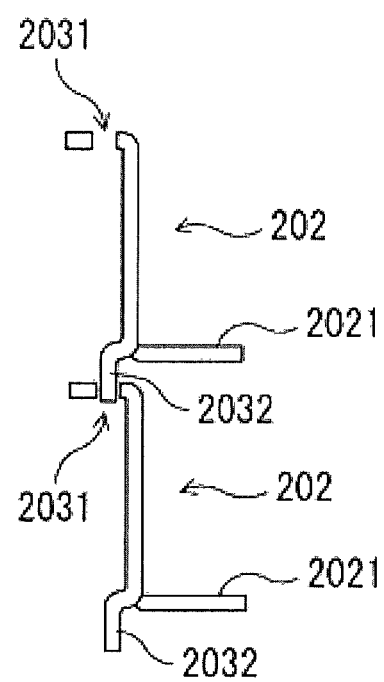
FIG. 14 is a view illustrating the position determining structure of the mounting clamp in which the electronic device as the example according to the embodiment is mounted.

FIGS. 13A and 13B to FIGS. 16A, 16B, and 16C are views illustrating the position determining structures of the mounting clamp 202 in which the electronic device 1 as the example according to the embodiment is mounted. FIG. 13A is a perspective view illustrating the upside of the mounting clamp 202, FIG. 13B is a perspective view illustrating the lower side of the mounting clamp 202, and FIG. 14 is a side sectional view illustrating an engagement structure between the mounting clamps 202.

Figure 16A:
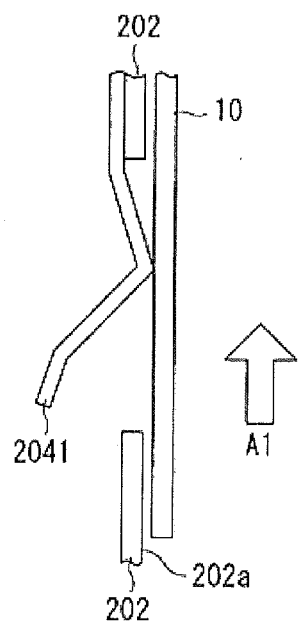
FIGS. 16A, 16B, and 16C are views illustrating the position determining structure of the mounting clamp in which the electronic device as the example according to the embodiment is mounted.
Figure 16B:
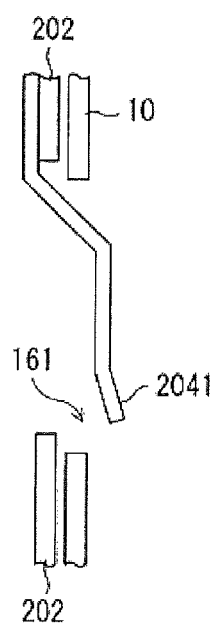
Figure 16C:
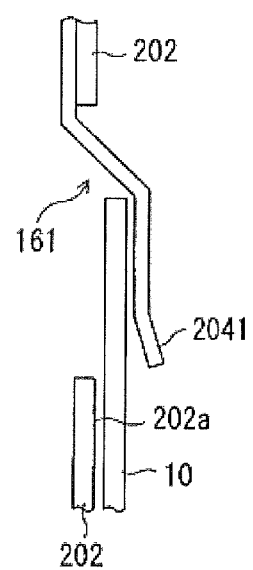

In addition, FIG. 15A is a perspective view illustrating the position of a hook 2041 in the mounting clamp 202, FIG. 15B is a diagram illustrating the hook 2041, and FIG. 15C is a perspective view illustrating the hook engagement hole 161 of the housing 10 of the electronic device 1. FIGS. 16A, 16B, and 16C are views illustrating a process of engaging the hook 2041 of the mounting clamp 202 with the hook engagement hole 161 of the housing 10.

As illustrated in FIG. 13A, one or more (three in an example illustrated in FIG. 13A) engagement holes 2031 are formed on the upper side of the mounting clamp 202 in the longitudinal direction in the example. In addition, as illustrated in FIG. 13B, one or more (three in an example illustrated in FIG. 13B) engage projections 2032 are provided on the lower side of the mounting clamp 202 in the longitudinal direction. In the mounting clamp 202, the respective engagement holes 2031, which are formed on the upper side of the longitudinal direction, and the respective engage projections 2032, which are formed on the lower side in the longitudinal direction, are formed at relevant positions.

The respective engagement holes 2031 are configured such that the engage projections 2032 may be engaged. When being attached to the rack 200, the engage projection 2032 of the mounting clamp 202, which is the side wall of an upward slot 210, is engaged with the engagement hole 2031 of the mounting clamp 202, which is the side wall of a lower-side slot 210, as illustrated in FIG. 14. Therefore, the positions of the mounting clamps 202, which are vertically adjacent to each other, of the rack 200 are determined.

Meanwhile, in the example, the engagement holes 2031 are formed on the upper side of the mounting clamp 202, and the engage projections 2032 are formed on the lower side thereof. However, the embodiment is not limited thereto and various modifications are possible. That is, the engagement holes 2031 may be formed on the lower side of the mounting clamp 202 and the engage projections 2032 may be formed on the upper side thereof. Further, the engagement holes 2031 and the engage projections 2032 may be mixed on the upper side and the lower side of the mounting clamp 202. In addition, two or less or four or more engagement holes 2031 and the engage projections 2032 may be provided.

In addition, as illustrated in FIG. 15A, the hook 2041 is formed on the inner wall surface 202a of the mounting clamp 202 so as to protrude. Meanwhile, in FIGS. 13A and 13B and FIG. 14, the hook 2041 is not illustrated in the drawing.

The hook 2041 is a rectangular plate member. As illustrated in FIG. 15A, the hook 2041 is arranged along the longitudinal direction of the mounting clamp 202, and the back end part thereof is fixed to the mounting clamp 202. In addition, as illustrated in FIG. 15B, the front end part thereof is separated from the inner wall surface 202a of the mounting clamp 202. Further, the hook 2041 is formed of an elastic member such as a metal plate.

In addition, as illustrated in FIG. 15C, on the side surface of the housing 10 of the electronic device 1, the hook engagement hole 161 is formed at a position which faces the hook 2041 in a state being mounted into the slot 210 of the rack 200.

Further, when the electronic device 1 is inserted into the slot 210 of the rack 200, the hook 2041 is engaged with the hook engagement hole 161 which is formed on the side surface of the housing 10 of the electronic device 1.

In examples illustrated in FIGS. 16A, 16B, and 16C, the lower side of the drawing corresponds to the front side of the electronic device 1 and the upper side of the drawing corresponds to the back side of the electronic device 1, respectively. That is, when the electronic device 1 is inserted into the slot 210, for example, the housing 10 moves as indicated by arrow A1 in FIG. 16A.

In the middle of inserting the housing 10 of the electronic device 1 into the slot 210, the hook 2041 comes into contact with the outside surface of the housing 10, as illustrated in FIG. 16A. In such a state, the hook 2041 is energized by the outside surface of the housing 10 and is pushed to the outside (the outside of the slot 210) rather than the inner wall surface 202a of the mounting clamp 202 by elastic deformation.

When the housing 10 is further inserted into the slot 210 from the state, the hook engagement hole 161 of the housing 10 reaches a position which faces the hook 2041. In this state, the energization of the hook 2041 is released from the outside surface of the housing 10, and the hook 2041 rushes into the housing 10 through the hook engagement hole 161, as illustrated in FIG. 16B.

When the housing 10 is further inserted into the slot 210 from the state, the housing 10 is engaged after breaking into between the hook 2041 and the inner wall surface 202a in the mounting clamp 202, as illustrated in FIG. 16C. Therefore, the position of the electronic device 1 is certainly determined with regard to the mounting clamp 202 on the left side in the slot 210. Since the positions of the mounting clamps 202, which are vertically adjacent to each other, are determined as described above, it is possible to determine the positions of the electronic devices 1 which are vertically adjacent to each other.

Meanwhile, in the above-described embodiment, the mounting clamp 202 includes the hook 2041 and the hook engagement hole 161 is formed in the housing 10. However, the embodiment is not limited thereto. That is, the hook 2041 may be provided on the side of the housing 10, and the hook engagement hole 161 may be formed on the side of the mounting clamp 202. In addition, various modifications are possible with regard to the number of the hooks 2041 and the engagement holes 161 and the positions of the hooks 2041 and the engagement holes 161.

(C) Aperture Opening and Closing Structure

As described above, the apertures 11 and 12 are formed in the housing 10 of the electronic device 1 as the example according to the embodiment, and connector connection is performed through the apertures 11 and 12.

In order to protect the first connectors 30 and the second connectors 40 which are provided in the apertures 11 and 12, it is preferable to shut down the respective apertures 11 and 12 in a state in which the electronic device 1 is not mounted in the rack 200 (non-mounted state). Here, the electronic device 1 performs lid shutdown on the apertures 11 and 12, and has a cover structure in which the apertures 11 and 12 are exposed as occasion calls.

Hereinafter, cover structures will be described in (C-1), (C-2), and (C-3). The electronic device 1 includes at least one of the cover structures described in (C-1), (C-2), and (C-3).

(C-1) First Cover Structure

Figure 17:
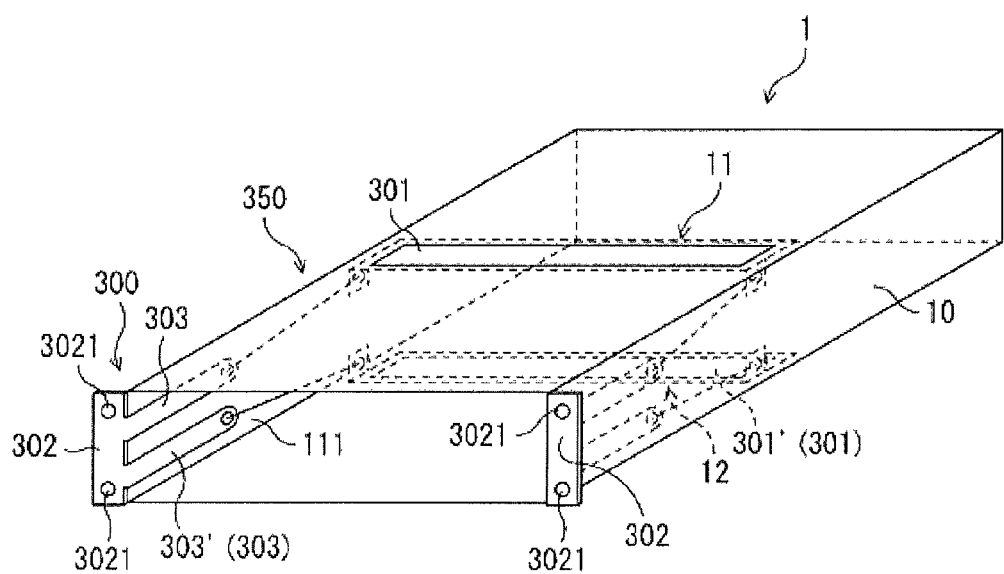
FIG. 17 is a perspective view illustrating the appearance of the electronic device as the example according to the embodiment.
Figure 18A:
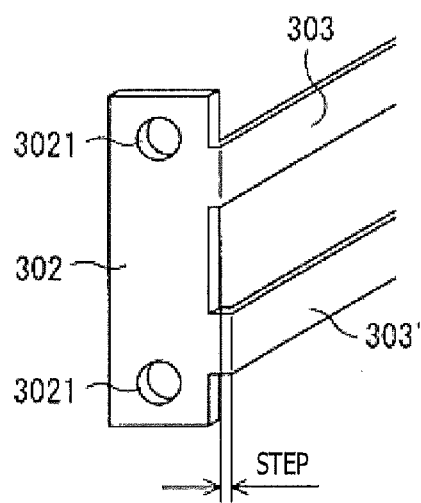
FIGS. 18A and 18B are views illustrating the positional relationship between a front plate and arms in the cover structure of the electronic device as the example according to the embodiment.
Figure 18B:
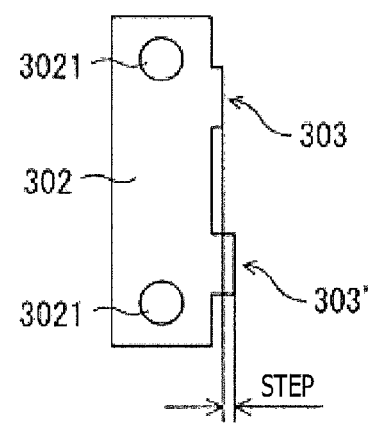

FIG. 17 is a perspective view illustrating the appearance of the electronic device 1 as the example according to the embodiment, and the electronic device 1 includes a cover structure 300. Meanwhile, in FIG. 17, a partial configuration of the cover structure 300 is not illustrated in the drawing. FIGS. 18A and 18B are views illustrating the positional relationship between a front plate 302 and arms 303 and 303' in the cover structure 300. FIG. 18A is a perspective view, and FIG. 18B is a front view.

Figure 19A:
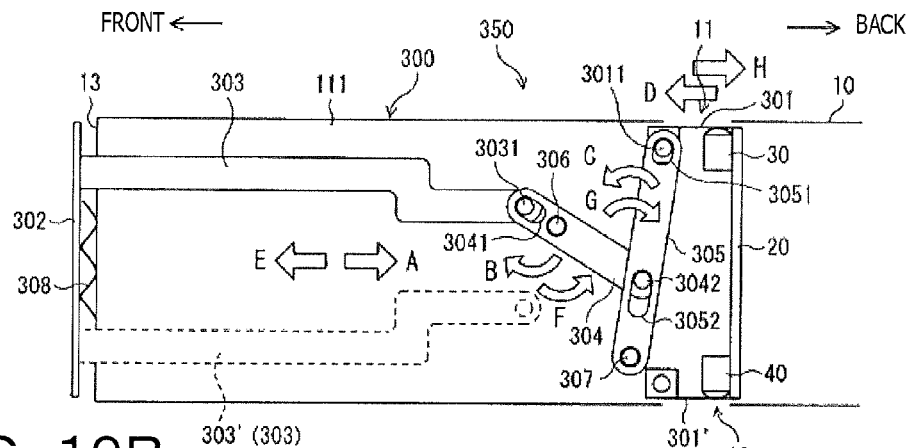
FIGS. 19A, 19B, and 19C are views illustrating an operation of opening and closing an aperture by the cover structure of the electronic device as the example according to the embodiment.
Figure 19B:
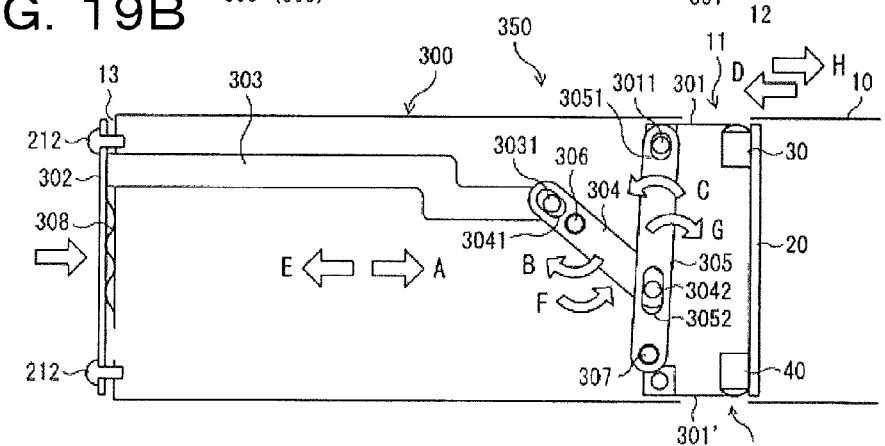
Figure 19C:
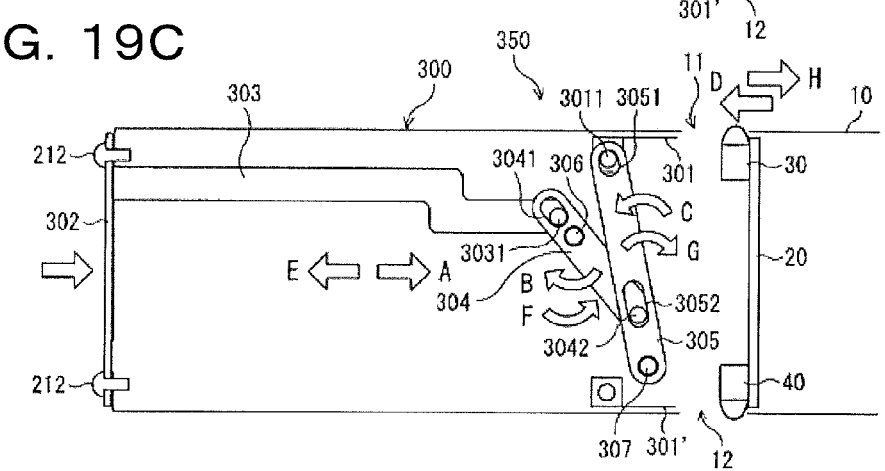

In addition, FIGS. 19A, 19B, and 19C are views illustrating the opening and closing operation of the aperture 11 by the cover structure 300 of the electronic device 1 as the example according to the embodiment. FIG. 19A illustrates a closed state, FIG. 19B illustrates a state in which an open operation is being performed, and FIG. 19C illustrates an open state, respectively.

The cover structure 300 opens and closes lids 301 and 301', which are provided in the apertures 11 and 12, by associating a fixing operation which fixes the electronic device 1 to the rack 200 with a releasing operation which releases the electronic device 1 fixed to the rack 200 in a state in which the electronic device 1 is inserted into the slot 210 of the rack 200.

That is, the cover structure 300 functions as a first opening and closing mechanism which opens and closes the aperture 11 using the lid 301, and functions as a second opening and closing mechanism which opens and closes the aperture 12 using the lid 301'.

Meanwhile, the aperture 11 includes the lid (first cover section) 301, and the aperture 12 includes the lid (second cover section) 301'. However, a mechanism which opens and closes the lid 301 and a mechanism which opens and closes the lid 301' have the same configuration.

More specifically, as illustrated in FIGS. 18A and 18B, the arm 303 and the arm 303' are connected to the front plate 302. Further, the lid 301 which is provided in the aperture 11 is opened and closed through a link mechanism 350 which includes the arm 303, and the lid 301' which is provided in the aperture 12 is opened and closed through the link mechanism 350 which includes the arm 303'.

In addition, as illustrated in FIGS. 18A and 18B, the arm 303 and the arm 303' are attached to the front plate 302 while having steps in the left and right direction of the housing 10. The reason for this is to inhibit the link mechanism 350, which includes the arm 303, and the link mechanism 350, which includes the arm 303', from being interfered.

When the arm 303 and the arm 303' are arranged at positions which are deviated in the left and right direction, the interference between the link mechanism 350 which includes the arm 303 and the link mechanism 350 which includes the arm 303' is reduced in the housing 10.

Hereinafter, for convenience of explanation, a mechanism which opens and closes the lid 301 provided in the aperture 11 will be described. For example, in FIGS. 19A, 19B, and 19C, the mechanism, which opens and closes the lid 301' provided in the aperture 12, is not illustrated in the drawing.

As illustrated in FIG. 17 and FIGS. 19A, 19B, and 19C, the cover structure 300 includes the lid 301 (301'), the front plate 302, and the link mechanism 350.

The lid 301 is a plate member which is provided to cover the aperture 11, and is configured to freely slide along the front and back direction of the housing 10. More specifically, the lid 301 sets a closed state by shutting down the aperture 11 in a state in which the lid 301 is at the back position in the front and back direction of the housing 10, and is set to an open state by opening the aperture 11 in a state in which the lid is at the front position.

As illustrated in FIG. 17, the link mechanisms 350 are respectively provided along the respective inner wall surfaces 111 in the left and right direction of the housing 10. As illustrated in FIGS. 19A, 19B, and 19C, the link mechanisms 350 includes arms 303 (303'), 304, and 305. Meanwhile, FIGS. 19A, 19B, and 19C, for convenience, only the link mechanism 350, which is provided on one inner wall surface in the housing 10 is illustrated in the drawing. The other link mechanism 350 which is not illustrated in the drawing is similarly configured and similarly operated as the link mechanism 350 which is illustrated in the drawing.

The above-described lid 301 includes a shaft 3011 which protrudes along the left and right direction of the housing 10, and a hole 3051, which is formed at one end of the arm 305 of the link mechanism 350, is pivoted in the shaft 3011.

In addition, on the other end side of the arm 305, the lid 301 is supported by a fulcrum 307 so as to be freely rotated on the inner wall surface of the housing 10. That is, when the arm 305 rotationally moves around the fulcrum 307 as the center, the end part of the arm 305 on the side of the hole 3051 moves in the front and back direction. Accordingly, the lid 301, which is connected through the shaft 3011, slides in the front and back direction. Meanwhile, the hole 3051 is formed as a long hole along the arm 305, and the shaft 3011 passes through the hole 3051. Therefore, when the arm 305 rotationally moves around the fulcrum 307, the movement of the lid 301 in the vertical direction is absorbed.

Further, a long hole 3052 is formed in the arm 305 along the longitudinal direction thereof, and a shaft 3042, which is formed at one end of the arm 304, freely slides and passes through the long hole 3052.

In addition, a hole 3041 is formed at the other end of the arm 304. The hole 3041 is formed as a long hole along the arm 304, and a shaft 3031, which is formed at one end of the arm 303, passes through the hole 3041.

Further, the arm 304 is supported on the inner wall surface of the housing 10 so as to be freely rotated by the fulcrum 306 between the shaft 3042 and the shaft 3031. That is, when the arm 303, which will be described later, causes one end of the arm 304 to move in the front and back direction through the shaft 3031, the arm 304 rotationally moves around the fulcrum 306. In addition, the other end of the arm 304 causes the arm 305 to rotationally move around the fulcrum 307 as the center in the front and back direction through the shaft 3042.

In addition, the front side end part of the arm 303 is fixed to the front plate 302 (refer to FIGS. 18A and 18B) as described above. The front plate 302 has the same shape as the rack fixing section 13 of the housing 10, and the front plate 302 overlaps with the rack fixing section 13 from the front. A number of front plate holes 3021, which is the same as the number of attachment holes 131 formed in the rack fixing section 13 of the housing 10, are formed in the front plate 302. The front plate holes 3021 communicate with the respective attachment holes 131 of the rack fixing section 13.

In a state in which the front plate holes 3021 are communicated with attachment holes 131 of the rack fixing sections 13, the screws 212 are inserted and are screwed into the fixing holes 2022 of the mounting clamp 202 which are attached to the rack 200, and thus the electronic device 1 is fixed to the rack 200.

An elastic member 308 is arranged between the front plate 302 and the rack fixing section 13. The elastic member 308 is energized in a direction in which the front plate 302 is separated from the rack fixing section 13, and, for example, a flat spring is used. However, the elastic member 308 is not limited to the flat spring, and, for example, another shaped spring, rubber, or the like may be used, and various modifications are possible.

When the electronic device 1 is fixed to the rack 200 as described above, the front plate 302 is pushed to the side of the rack fixing section 13 and moves to the back side by fastening the screws 212. In addition, when the screws 212 are unfastened, the front plate 302 is extruded by the elastic member 308. That is, the front plate 302 functions as a movement member which moves in accordance that the electronic device 1 is fixed to or released from the rack 200.

An operation of opening and closing the lid 301 by the cover structure 300 of the electronic device 1, which is configured as described above, as the example according to the embodiment will be described with reference to FIGS. 19A to 19C.

In a state illustrated in FIG. 19A, the lid 301 is in an open state, and the front plate 302 and the rack fixing section 13 are in a separated state.

In the state illustrated in FIG. 19A, an operator attaches the screws 212 to the front plate holes 3021 of the front plate 302 and the attachment holes 131 of the rack fixing section 13, and fastens the screws 212.

When the screws 212 are fastened, the front plate 302 is pushed to the side of the rack fixing section 13, and the arm 303 moves to the back side (refer to arrow A in FIGS. 19A and 19B).

When the arm 303 moves to the back side, the upper end part of the arm 304 is pushed to the back side through the shaft 3031 of the arm 303 and the shaft hole 3041 of the arm 304. Therefore, the arm 304 rotationally moves around the fulcrum 306 (refer to arrow B in FIGS. 19A and 19B) as the center, and the lower end of the arm 304 moves to the front side.

When the lower end of the arm 304 moves to the front side, the arm 305 is pushed to the front side through the shaft 3042 of the arm 304 and the long hole 3052 of the arm 305, and the arm 305 rotationally moves to the front side around the fulcrum 307 (refer to arrow C in FIGS. 19A and 19B) as the center.

When the arm 305 rotationally moves to the front side around the fulcrum 307 as the center, the upper end part of the arm 305 moves to the front side. Accordingly, the lid 301 which is connected through the shaft 3011 slides to the front side (refer to arrow D in FIGS. 19A and 19B). That is, as illustrated in FIG. 19C, the lid 301 is open and the aperture 11 is opened.

The same operation is performed in the link mechanism 350 which includes the arm 303' and which is not illustrated in the drawing. At the same time that the aperture 11 is opened, the lid 301' is opened and the aperture 12 is opened.

Meanwhile, in a state in which the front plate 302 comes into contact with the side of the rack fixing section 13 by fastening the screws 212, the lengths of the respective arms 303 to 305, the positions of the respective fulcrums 306 and 307, and the like are adjusted such that the lid 301 completely open the aperture 11.

In addition, the aperture 11 is closed by the lid 301 in reverse order of the above-described order. That is, when the lid 301 illustrated in FIG. 19C is in an open state and the operator unfastens the fastened screws 212, the front plate 302 is pushed in a direction which is separated from the rack fixing section 13, that is, to the front side by the elastic member 308. Therefore, the arm 303 moves to the front side (refer to arrow E in FIGS. 19C and 19B).

When the arm 303 moves to the front side, the upper end part of the arm 304 is drawn to the front side through the shaft 3031 of the arm 303 and the shaft hole 3041 of the arm 304. Therefore, the arm 304 rotationally moves around the fulcrum 306 (refer to arrow F in FIGS. 19C and 19B) as the center, and the lower end of the arm 304 moves to the back side.

When the lower end of the arm 304 moves to the back side, the arm 305 is pushed to the back side through the shaft 3042 of the arm 304 and the long hole 3052 of the arm 305, and the arm 305 rotationally moves to the back side around the fulcrum 307 (refer to arrow G in FIGS. 19A and 19B).

When the arm 305 rotationally moves to the back side around the fulcrum 307 as the center, the upper end part of the arm 305 moves to the back side. Accordingly, the lid 301, which is connected through the shaft 3011, slides to the back side (refer to arrow H in FIGS. 19A and 19B). That is, as illustrated in FIG. 19A, the lid 301 is closed and the aperture 11 is closed.

The same operation is performed in the link mechanism 350, which includes the arm 303' and which is not illustrated in the drawing. At the same time that the aperture 11 is closed, the lid 301' is closed and the aperture 12 is closed.

In the cover structure 300, which is configured as described above, the electronic device 1 is inserted into the slot 210 of the rack 200, and the electronic device 1 is fixed to the rack 200 by fastening the screws 212, and thus the lid 301 is open and the apertures 11 and 12 are open. Therefore, in the rack 200, it is possible to securely perform connector connection between other electronic devices 1 in the upper and lower slots 210.

In addition, in a state in which the screws 212 are removed and the electronic device 1 is ejected from the slot 210 of the rack 200, the lid 301 is closed and the apertures 11 and 12 are closed. Therefore, it is possible to protect the first connectors 30 and the second connectors 40 in a state in which the electronic device 1 is detached from the rack 200.

(C-2) Second Example of Cover Structure

Figure 20:
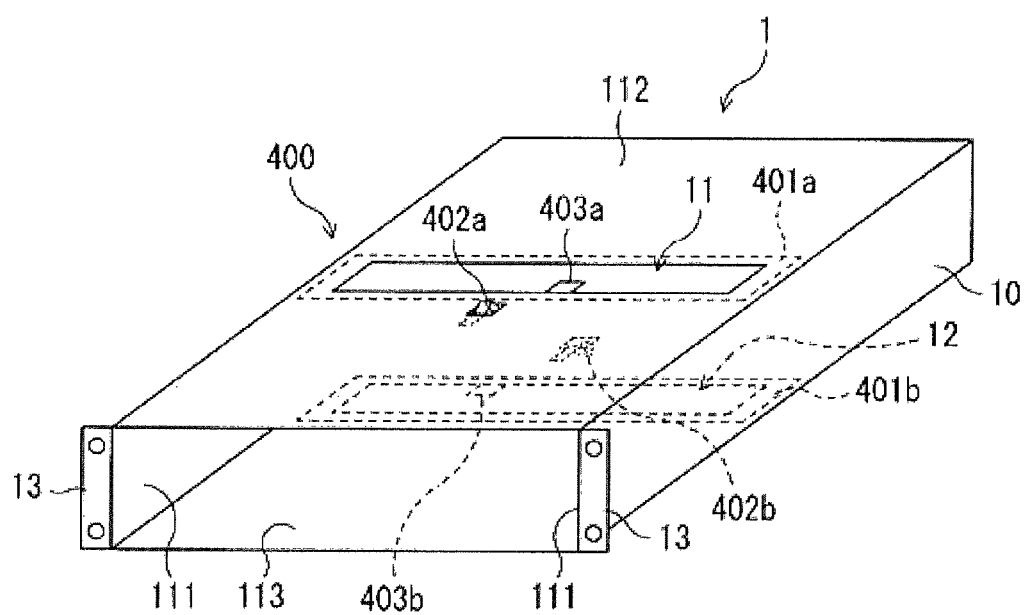
FIG. 20 is a perspective view illustrating the appearance of the electronic device as the example according to the embodiment.
Figure 21:
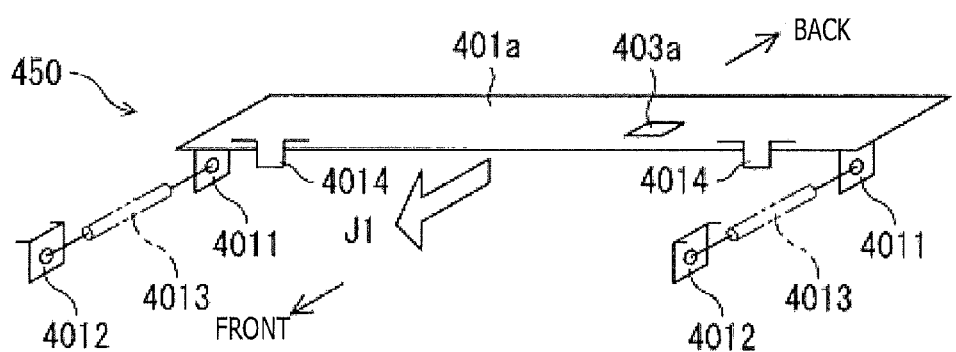
FIG. 21 is a perspective view illustrating the configuration of a lid shutdown mechanism in the cover structure of the electronic device as the example according to the embodiment.
Figure 22:
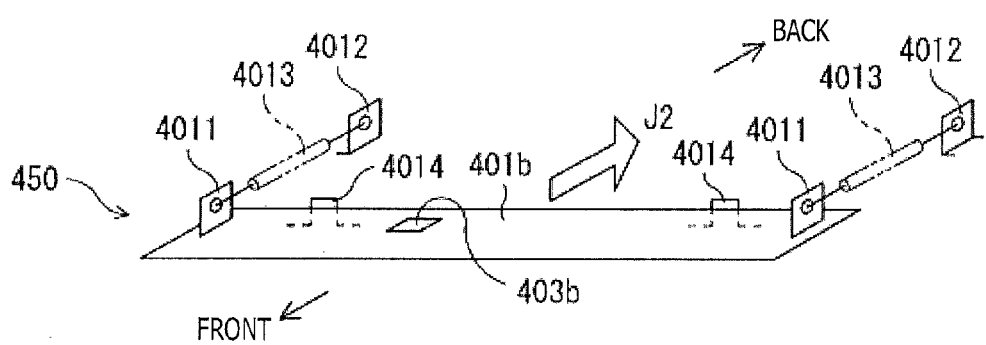
FIG. 22 is a perspective view illustrating the configuration of the lid shutdown mechanism in the cover structure of the electronic device as the example according to the embodiment.
Figure 23:
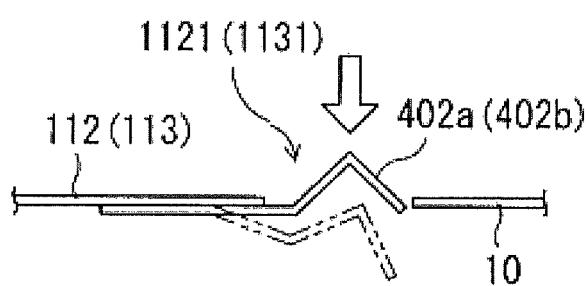
FIG. 23 is a side view illustrating the configuration of hook sections in the cover structure of the electronic device as the example according to the embodiment.
Figure 24:
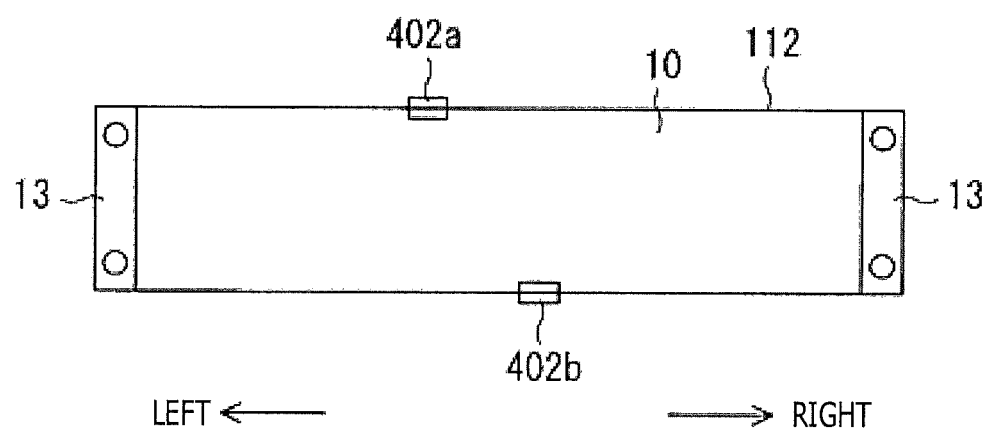
FIG. 24 is a view illustrating the positions of the hook sections in the housing of the electronic device as the example according to the embodiment.

FIG. 20 is a perspective view illustrating the appearance of the electronic device 1 as the example according to the embodiment, and the electronic device 1 includes a cover structure 400. Meanwhile, in FIG. 20, some components of the cover structure 400 are not illustrated in the drawing. FIG. 21 is a perspective view illustrating the configuration of the shutdown mechanism 450 of a lid 401a in the cover structure 400 of the electronic device 1 as the example according to the embodiment, and FIG. 22 is a perspective view illustrating the shutdown mechanism 450 of a lid 401b in the cover structure 400 of the electronic device 1 as the example according to the embodiment. In addition, FIG. 23 is a side view illustrating the configurations of hook sections 402a (402b), and FIG. 24 is a view illustrating the positions of the hook sections 402a and 402b in the housing 10.

Figure 25A:
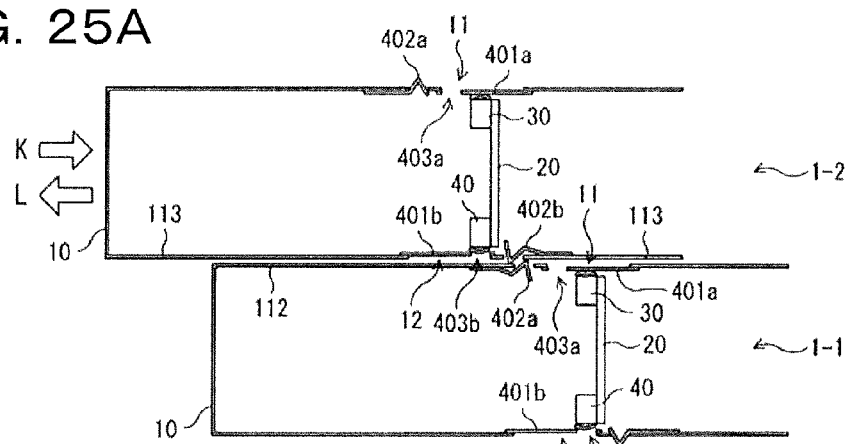
FIGS. 25A, 25B, and 25C are views illustrating the operation of opening and closing the aperture by the cover structure of the electronic device as the example according to the embodiment.
Figure 25B:
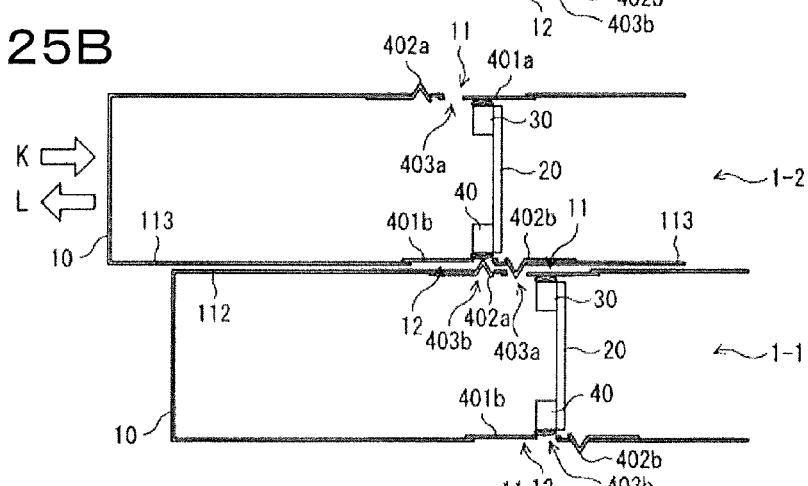
Figure 25C:
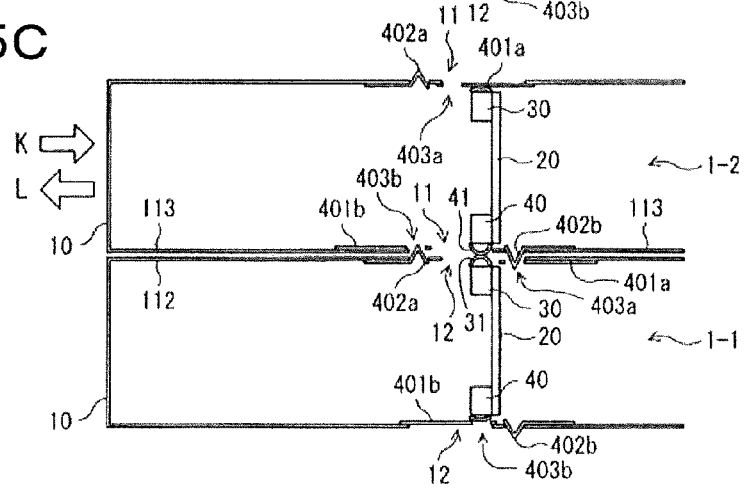

Further, FIGS. 25A, 25B, and 25C are views illustrating an operation of opening and closing the aperture 11 by the cover structure 400 of the electronic device 1 as the example according to the embodiment, FIG. 25A illustrates a closed state, FIG. 25B illustrates a state in which an opening operation is being performed, and FIG. 25C illustrates an open state, respectively.

When the electronic device 1 is inserted into or extracted from the slot 210 of the rack 200, the cover structure 400 opens and closes the lid 401a, which is provided in the aperture 11, and the lid 401b which is provided in the aperture 12.

As illustrated in FIG. 20 and FIGS. 25A, 25B, and 25C, the cover structure 400 includes the lids 401a and 401b, and the hook sections 402a and 402b.

The lid 401a is a plate member which is provided to cover the aperture 11, and is configured to freely slide along the front and back direction of the housing 10. More specifically, when the lid 401a is at the back-side position in the front and back direction of the housing 10, the state is set to the open state by opening the aperture 11. When the lid 401a is at the front-side position, the state is set to the closed state by shutting down the aperture 11.

The lid 401b is a plate member which is provided to cover the aperture 12, and is configured to freely slide along the front and back direction of the housing 10. More specifically, when the lid 401b is at the back-side position in the front and back direction of the housing 10, the state is set to the closed state by shutting down the aperture 12. When the lid 401b is at the front-side position, the state is set to the open state by opening the aperture 12.

Hereinafter, there is a case, in which the state in which the lid 401a is at the front-side position and the aperture 11 is shut down, is referred to as a state in which the lid 401a is at a shutdown position, and there is a case, in which a state in which the lid 401a is at the back-side position and the aperture 11 is open, is referred to as a state in which the lid 401a is at the open position.

In addition, there is a case, in which a state in which the lid 401b is at the back-side position and the aperture 12 is shut down, is referred to as a state in which the lid 401b is at the shutdown position, and there is a case, in which a state in which the lid 401b is at the front-side position and the aperture 12 is open, is referred to as a state in which the lid 401b is at the open position.

In addition, the lids 401a and 401b are respectively energized by the shutdown mechanism 450 in directions in which the apertures 11 and 12 are shut down.

As illustrated in FIGS. 21 and 22 the shutdown mechanism 450 includes springs 4013, and the lids 401a and 401b are respectively energized by the springs 4013 in directions in which the lids 401a and 401b are set to the closed state.

For example, as illustrated in FIG. 21, the springs 4013 are provided to connect first attachment sections 4011, which protrude downward in the vicinities of both end parts of the lid 401a in the left and right directions, to second attachment sections 4012 which protrude from the top plate 112 in the vicinities of the respective inner wall surfaces 111 in the housing 10 in the left and right directions, and energizes the lid 401a in a direction in which the lid 401a is drawn to the front side (refer to arrow 31).

Similarly, as illustrated in FIG. 22, springs 4013 are provided to connect first attachment sections 4011, which protrude toward the upper side of the lid 401b in the vicinities of both end parts of the lid 401b in the left and right directions, to second attachment sections 4012 which protrude from the bottom plate 113 in the vicinities of the respective inner wall surfaces 111 in the housing 10 in the left and right directions, and energizes the lid 401b in a direction in which the lid 401b is drawn to the back side (refer to arrow 32).

Meanwhile, as illustrated in FIG. 21, stoppers 4014 are provided to protrude at positions, which are rather front side than the aperture 11 on the upper surface of the housing 10, and thus a configuration is made such that the lid 401a stops at a position where the aperture 11 is shut down, by the stoppers 4014.

In addition, as illustrated in FIG. 22, stoppers 4014 are provided to protrude at positions, which are rather the back side than an aperture 21 on the lower surface of the housing 10, and thus a configuration is made such that the lid 401b stops at a position where the aperture 12 is shut down, by the stoppers 4014.

In addition, a lid hole (first engagement section) 403a is formed in the lid 401a, and, a lid hole (first engagement section) 403b is formed in the lid 401b, respectively.

In a state in which the electronic device 1 is inserted into the slot 210 of the rack 200, the hook section 402b (which will be described later) of another adjacent electronic device 1, which is inserted into an upper-side slot 210 of the slot 210, is engaged with the lid hole 403a in the rack 200.

In addition, in a state in which the electronic device 1 is inserted into the slot 210 of the rack 200, the hook section 402a (which will be described later) of another electronic device 1, which is inserted into an adjacent slot 210 on the down side of the slot 210 in the rack 200, is engaged with the lid hole 403b.

In the top plate 112 of the housing 10, the hook section (second engagement section) 402a protrudes to the upper side on the front side rather than the aperture 11. In addition, in the bottom plate 113 of the housing 10, the hook section (second engagement section) 402b protrudes to the lower side on the back side of the aperture 12.

As illustrated in FIG. 23, the hook section 402a has a mountain shape which includes respective inclined surfaces in the front and back direction of the housing 10, and protrudes from the hole 1121, which is formed in the top plate 112 of the housing 10, toward the outside (upper side) of the housing 10 to be freely drawn and inserted.

The hook section 402b has the same configuration as the hook section 402a. That is, as illustrated in FIG. 23, the hook section 402b has a mountain shape which includes respective inclined surfaces in the front and back direction of the housing 10, and protrudes from the hole 1131, which is formed in the bottom plate 113 of the housing 10, toward the outside (lower side) of the housing 10 to be freely drawn and inserted.

In the example illustrated in FIG. 23, the hook sections 402a (402b) are configured, for example, by bending the flat spring to the mountain shape and fixing one end part to the top plate 112 (bottom plate 113) of the housing 10.

Meanwhile, the hook sections 402a and 402b are not limited to the flat spring, and various modifications are possible. For example, a member which is formed in a mountain shape may be caused to protrude from the hole 1121 to be freely drawn and inserted by an elastic member such as spring.

In addition, as illustrated in FIG. 24, the hook section 402a and the hook section 402b are arranged at positions which are deviated in the left and right direction of the housing 10. In an example illustrated in FIG. 24, the hook section 402a is arranged at a position which is deviated to the left side from the center of the housing 10, and the hook section 402b is arranged at a position which is deviated to the right side from the center of the housing 10.

As described above, the hook section 402a is engaged with the lid hole 403b of the lid 401b, and the hook section 402b is engaged with the lid hole 403a of the lid 401a. Accordingly, the lid hole 403b is formed at a position corresponding to the hook section 402a, and is formed at the same position in the left and right direction. Similarly, the lid hole 403a is formed at a position corresponding to the hook section 402b, and is formed at the same position in the left and right direction. Therefore, the lid hole 403a and the lid hole 403b are arranged at positions which are deviated in the left and right direction of the housing 10.

The operation of opening and closing the lids 401a and 401b performed by the cover structure 400 of the electronic device 1, which is configured as described above, as the example according to the embodiment will be described with reference to FIGS. 25A, 25B, and 25C.

Meanwhile, for convenience, FIGS. 25A, 25B, and 25C illustrate both the hook section 402a and the hook section 402b, which are arranged at the positions deviated in the left and right direction of the housing 10, as described above.

In a state illustrated in FIG. 25A, an electronic device 1-1 is inserted into the slot 210 of the rack 200, and an electronic device 1-2 is inserted into an adjacent slot 210, which is on the upper side of the slot 210 to which the electronic device 1-1 is inserted, by the operator.

In addition, in the state illustrated in FIG. 25A, the lid 401a of the electronic device 1-1 and the lid 401b of the electronic device 1-2 are respectively provided at shutdown positions, and thus both the apertures 11 and 12 are shut down.

Further, in the state illustrated in FIG. 25A, the hook section 402a of the electronic device 1-1 comes into contact with the bottom plate 113 of the housing 10 of the electronic device 1-2. In addition, the hook section 402b of the electronic device 1-2 comes into contact with the top plate 112 of the housing 10 of the electronic device 1-1.

When the operator further pushes the electronic device 1-2 to the slot 210 of the rack 200 (refer to arrow K) from the state illustrated in FIG. 25A, the hook section 402b of the electronic device 1-2 enters the lid hole 403a which is formed in the lid 401a of the electronic device 1-1 as illustrated in FIG. 25B. That is, the hook section 402b of the electronic device 1-2 is engaged with the lid hole 403a of the lid 401a of the electronic device 1-1.

In addition, the hook section 402a of the electronic device 1-1 enters the lid hole 403b which is formed in the lid 401b of the electronic device 1-2. That is, the hook section 402a of the electronic device 1-1 is engaged with the lid hole 403b of the lid 401b of the electronic device 1-2.

Further, in the state illustrated in FIG. 25B, the operator further pushes the electronic device 1-2 to the slot 210 of the rack 200 (refer to arrow K). Therefore, the electronic device 1-2 is moved to the back side. In the electronic device 1-1, the lid 401a of the electronic device 1-1, which is engaged with the hook section 402b of the electronic device 1-2, also moves to the back side. When the lid 401a moves to the back side, the aperture 11 is open as illustrated in FIG. 25C.

In addition, in the electronic device 1-2, when the electronic device 1-2 moves to the back side, the lid 401b of the electronic device 1-2, which is engaged with the hook section 402a of the electronic device 1-1, relatively moves to the front side. When the lid 401b moves to the front side, the aperture 12 is open as illustrated in FIG. 25C.

In addition, the aperture 11 is closed by the lid 401a and the aperture 12 is closed by the lid 401b in reverse order of the above-described order.

In the respective open states of the lids 401a and 401b which are illustrated in FIG. 25C, the hook section 402b of the electronic device 1-2 is engaged with the lid hole 403a of the lid 401a of the electronic device 1-1, and the hook section 402a of the electronic device 1-1 is engaged with the lid hole 403b of the lid 401b of the electronic device 1-2.

The operator moves the electronic device 1-2 to the front side (refer to arrow L) in order to extract the electronic device 1-2 from the slot 210 of the rack 200.

Therefore, the electronic device 1-2 moves to the front side. Accordingly, in the electronic device 1-1, the lid 401a of the electronic device 1-1, which is engaged with the hook section 402b of the electronic device 1-2, slides to the front side, as illustrated in FIG. 25B.

In addition, in the electronic device 1-2, the electronic device 1-2 moves to the front side. Accordingly, the lid 401b of the electronic device 1-2, which is engaged with the hook section 402a of the electronic device 1-1, slides to the relatively back side, as illustrated in FIG. 25B.

Further, when the operator further moves the electronic device 1-2 to the front side (refer to arrow L), the engagement of the hook section 402b of the electronic device 1-2 and the lid hole 403a of the lid 401a of the electronic device 1-1 is released, as illustrated in FIG. 25A.

The lid 401a is energized in a direction in which the aperture 11 is shut down by the shutdown mechanism 450. Therefore, when the engagement of the hook section 402b of the electronic device 1-2 and the lid hole 403a of the lid 401a of the electronic device 1-1 is released, the lid 401a is arranged at the shutdown position by the shutdown mechanism 450, thereby setting the aperture 11 to the closed state.

In addition, the lid 401b is also energized in a direction in which the aperture 12 is shut down by the shutdown mechanism 450. Therefore, when the engagement of the hook section 402a of the electronic device 1-1 and the lid hole 403b of the lid 401b of the electronic device 1-2 is released, the lid 401b is arranged at the shutdown position by the shutdown mechanism 450, thereby setting the aperture 12 to the closed state.

In the cover structure 400, which is configured as described above, when the electronic device 1 is inserted into the slot 210 of the rack 200, the hook section 402b of the electronic device 1-2 is engaged with the lid hole 403a of the lid 401a of the electronic device 1-1. In addition, the hook section 402a of the electronic device 1-1 is engaged with the lid hole 403b of the lid 401b of the electronic device 1-2.

When the operator further pushes the electronic device 1-2 to the slot 210 of the rack 200 in the state in which the engagement is performed, the lids 401a and 401b of the electronic device 1-2 are respectively arranged at open positions, and thus both the apertures 11 and 12 are open.

Therefore, it is possible to securely perform connector connection between different electronic devices 1 in the upper and lower slots 210 in the rack 200.

In addition, the lids 401a and 401b are respectively energized in a direction, in which the apertures 11 and 12 are shut down by the shutdown mechanism 450. Therefore, in a state in which the electronic device 1 is ejected from the slot 210 of the rack 200, the respective lids 401a and 401b are closed, and thus the apertures 11 and 12 are closed. Therefore, in a state in which the electronic device 1 is detached from the rack 200, it is possible to secure the first connectors 30 and the second connectors 40.

When the inner side surfaces of the lids 401a and 401b come into contact with the contact clamps of the first connectors 30 and the second connectors 40, the contact clamps in the first connectors 30 and the second connectors 40 are short-circuited, and thus there is a problem in that troubles occur. In such a case, the troubles may be dealt with by attaching insulation sheets to the inner side surfaces of the lids 401a and 401b or by manufacturing the lids 401a and 401b by insulation materials.

(C-3) Third Example of Cover Structure

The above-described second example of the cover structure is suitable for a case in which electronic devices 1 are sequentially inserted into the rack 200 from the lower-side slot 210 to the upper-side slot 210. However, when an electronic device 1 is inserted to an adjacent slot 210 on the lower side of an electronic device 1 which is mounted in the rack 200 in advance, the hook section 402a which is arranged on the upper part of the downward electronic device 1 is not engaged with the lid hole 403b of the lid 401b on the lower side of the upper-side electronic device 1. That is, when the electronic device 1 is inserted into the lower side of the electronic device 1 which is mounted in the rack 200 in advance, it is difficult to open the aperture 12 by moving the lid 401b of the upper-side electronic device 1.

For example, in a state in which a plurality of electronic devices 1 are mounted in the rack 200, the following situations occur when the lower-side electronic device 1 is broken down and thus is exchanged.

Here, in the electronic device 1 described in the third example of the cover structure, an electronic device 1 is inserted into the lower side of the electronic device 1, which is mounted in the rack 200 in advance, in addition to the configuration described in the above-described second example of the cover structure, thereby having a structure in which it is possible to open the aperture 12 of the upper-side electronic device 1.

Figure 26:
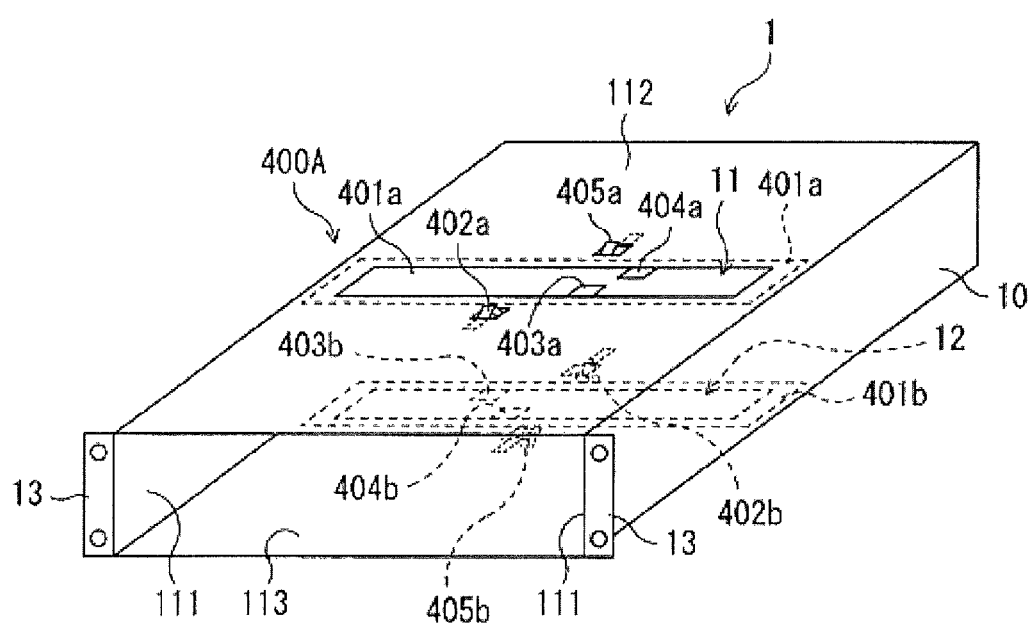
FIG. 26 is a perspective view illustrating the appearance of the electronic device as the example according to the embodiment.
Figure 27:
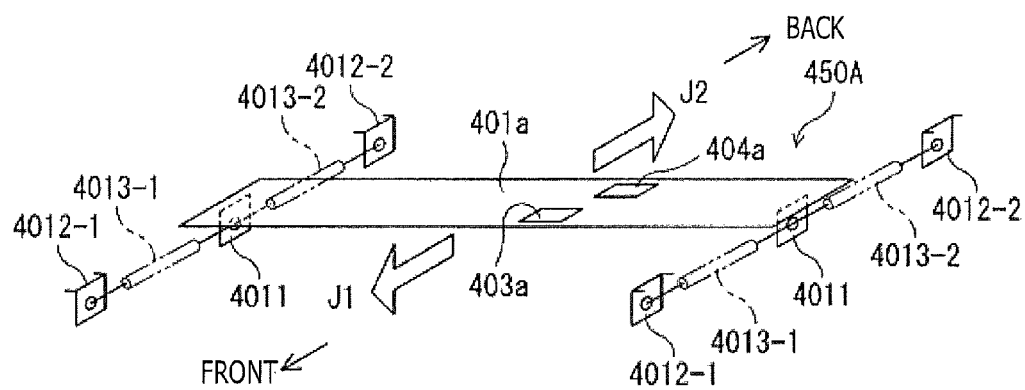
FIG. 27 is a perspective view illustrating the configuration of the lid shutdown mechanism in the cover structure of the electronic device as the example according to the embodiment.
Figure 28:
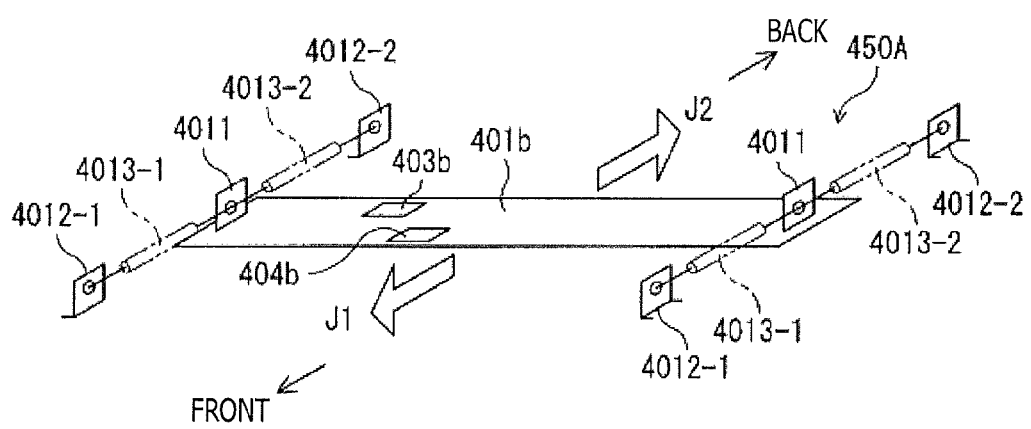
FIG. 28 is a perspective view illustrating the configuration of the lid shutdown mechanism in the cover structure of the electronic device as the example according to the embodiment.
Figure 29:
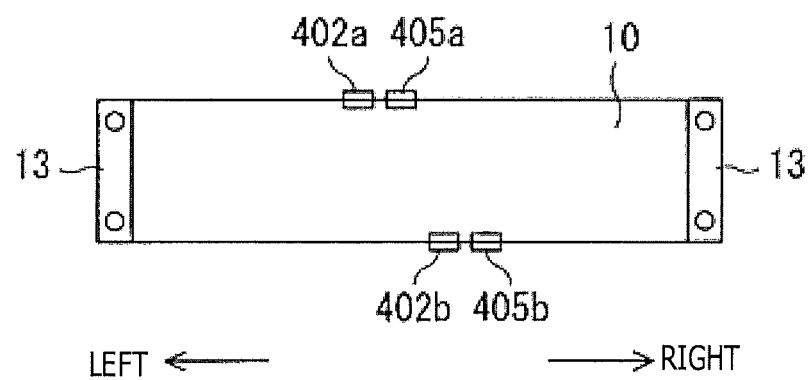
FIG. 29 is a view illustrating the positions of the hook sections in the housing of the electronic device as the example according to the embodiment.

FIG. 26 is a perspective view illustrating the appearance of an electronic device 1 as the example according to the embodiment, and the electronic device 1 includes a cover structure 400A. Meanwhile, in FIG. 26, the configuration of a part of the cover structure 400A is not illustrated in the drawing. FIG. 27 is a perspective view illustrating the configuration of a shutdown mechanism 450A of the lid 401a in the cover structure 400A of the electronic device 1 as the example according to the embodiment, and FIG. 28 is a perspective view illustrating the configuration of the shutdown mechanism 450A of the lid 401b in the cover structure 400A of the electronic device 1 as the example according to the embodiment. In addition, FIG. 29 is view illustrating the positions of the hook sections 402a, 402b, 405a, and 405b in the housing 10.

Figure 30:
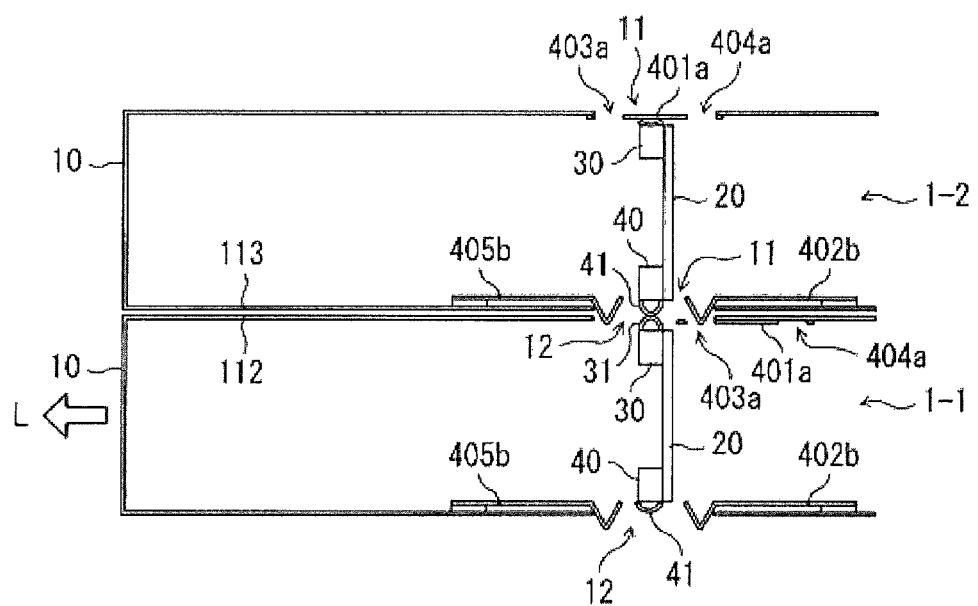
FIG. 30 is a view illustrating an operation of opening and closing a lid by the cover structure of the electronic device as the example according to the embodiment.
Figure 31:
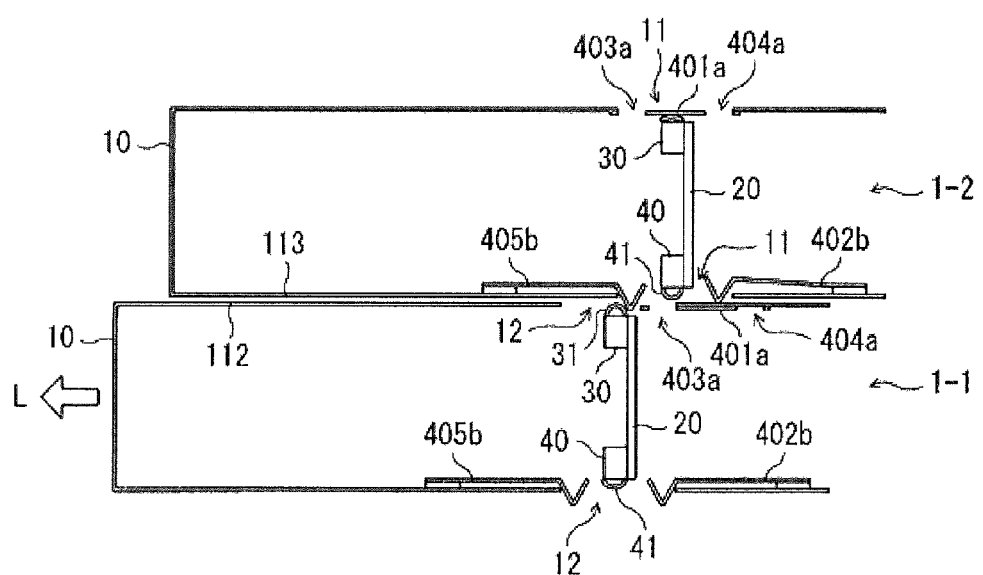
FIG. 31 is a view illustrating the operation of opening and closing the lid by the cover structure of the electronic device as the example according to the embodiment.
Figure 32:
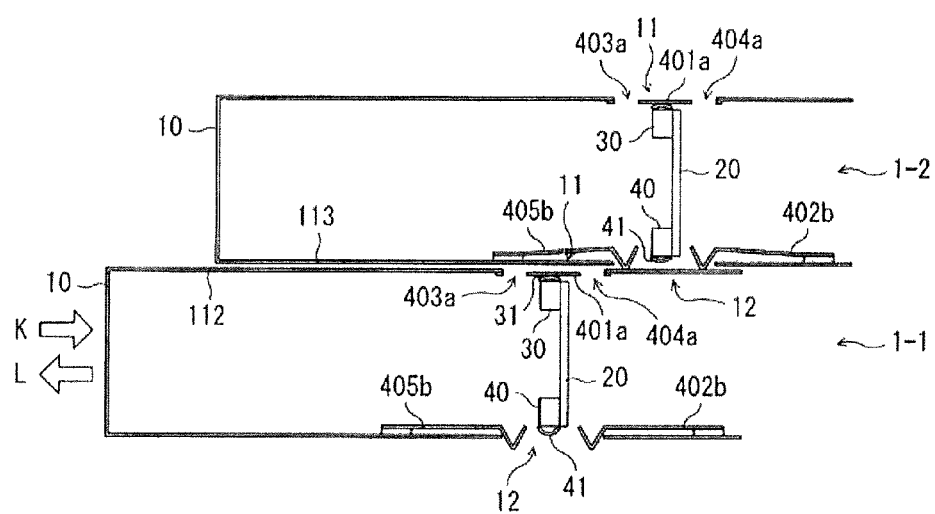
FIG. 32 is a view illustrating the operation of opening and closing the lid by the cover structure of the electronic device as the example according to the embodiment.
Figure 33:
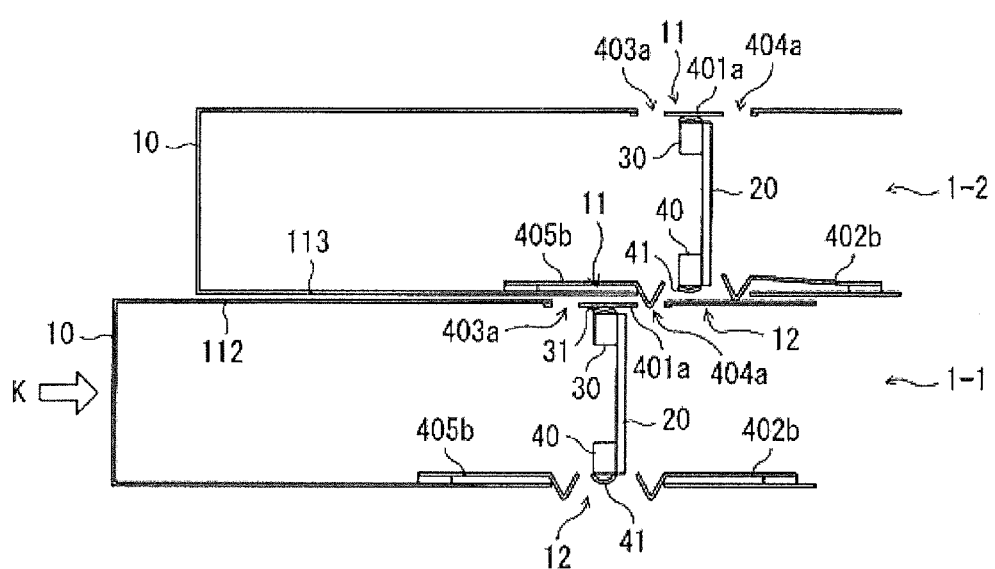
FIG. 33 is a view illustrating the operation of opening and closing the lid by the cover structure of the electronic device as the example according to the embodiment.
Figure 34:
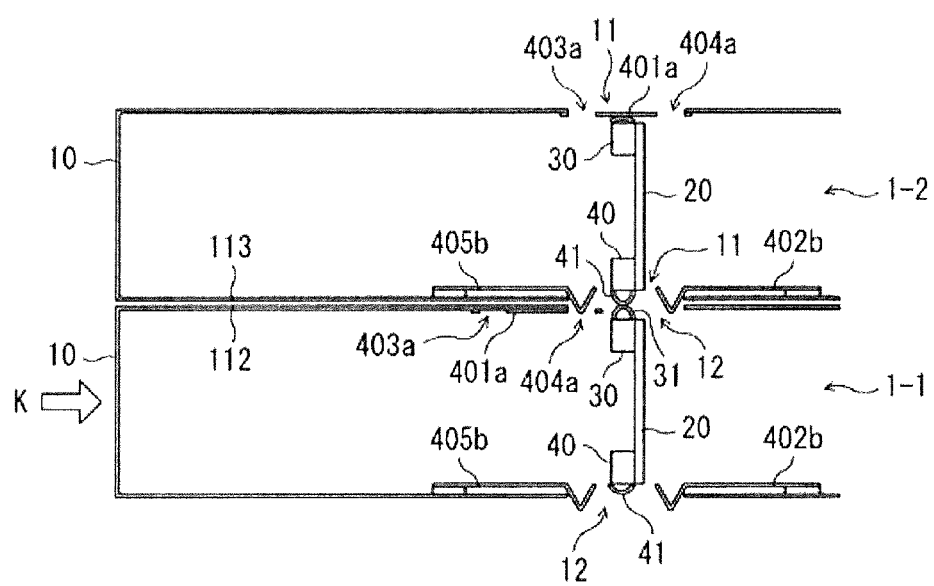
FIG. 34 is a view illustrating the operation of opening and closing the lid by the cover structure of the electronic device as the example according to the embodiment.

FIGS. 30 to 34 are views illustrating an operation of opening and closing the lid 401a by the cover structure 400A of an electronic device 1 as the example according to the embodiment. FIGS. 30 and 34 illustrate a state in which a plurality of electronic devices 1 are mounted in the rack 200 (open state), and FIGS. 31 and 32 illustrate a state in the middle of extracting a lower-side electronic device 1 from the rack 200 (in the middle of closing operation). In addition, FIG. 33 illustrates a state in the middle of inserting the lower-side electronic device 1 to the rack 200 (in the middle of opening operation).

Figure 35:
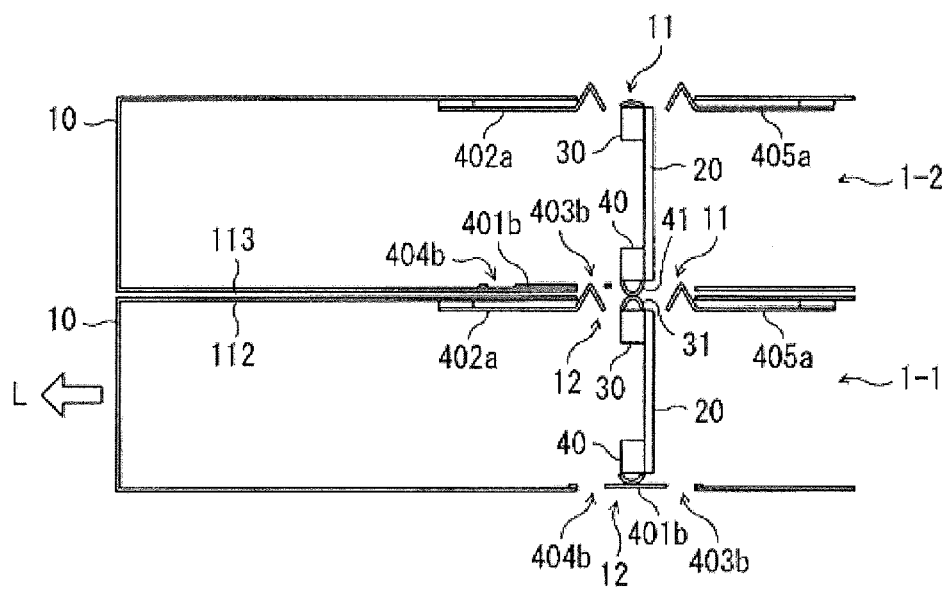
FIG. 35 is a view illustrating the operation of opening and closing the lid by the cover structure of the electronic device as the example according to the embodiment.
Figure 36:
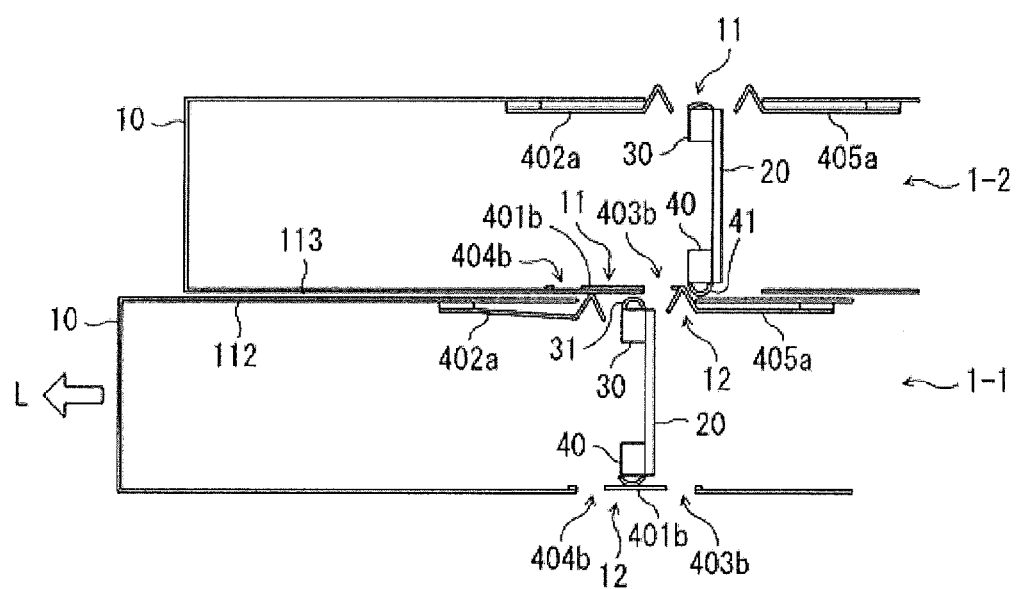
FIG. 36 is a view illustrating the operation of opening and closing the lid by the cover structure of the electronic device as the example according to the embodiment.
Figure 37:
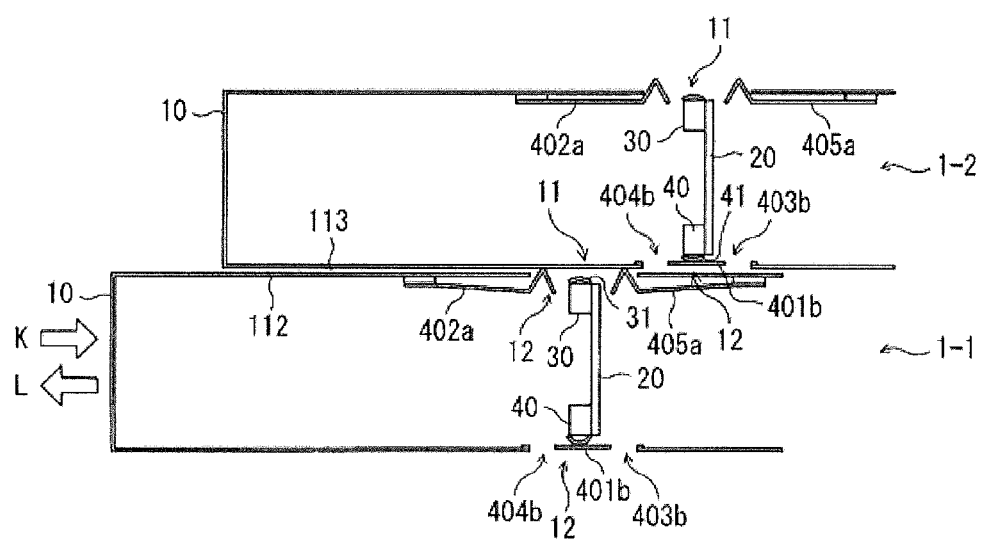
FIG. 37 is a view illustrating the operation of opening and closing the lid by the cover structure of the electronic device as the example according to the embodiment.
Figure 38:
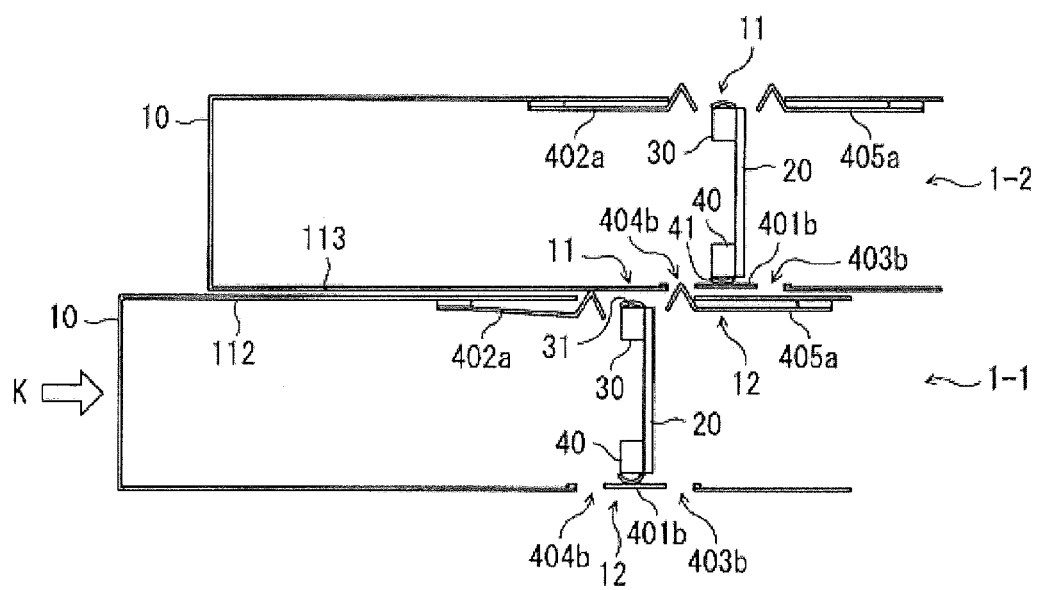
FIG. 38 is a view illustrating the operation of opening and closing the lid by the cover structure of the electronic device as the example according to the embodiment.
Figure 39:
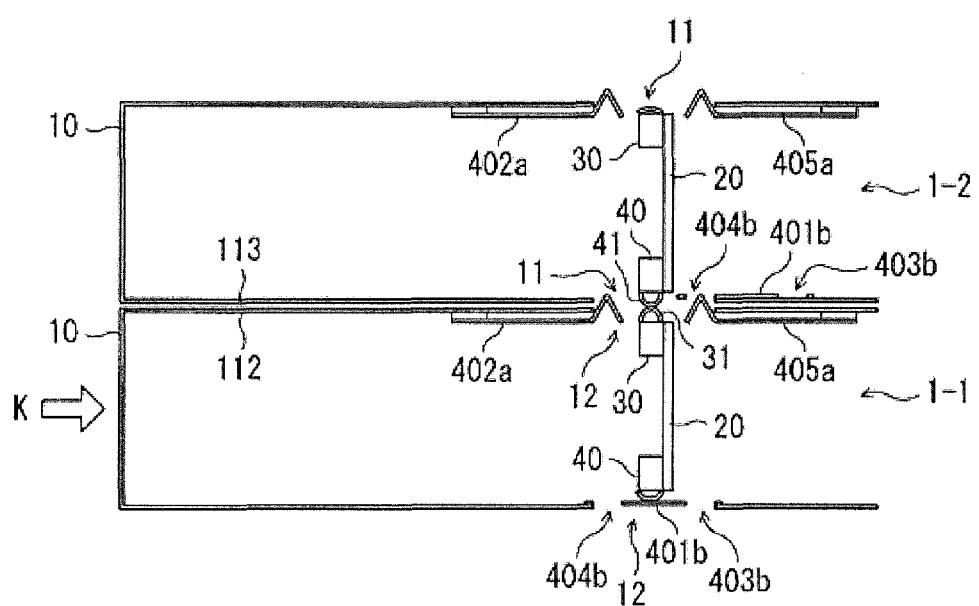
FIG. 39 is a view illustrating the operation of opening and closing the lid by the cover structure of the electronic device as the example according to the embodiment.
Figures 40A, 40B:
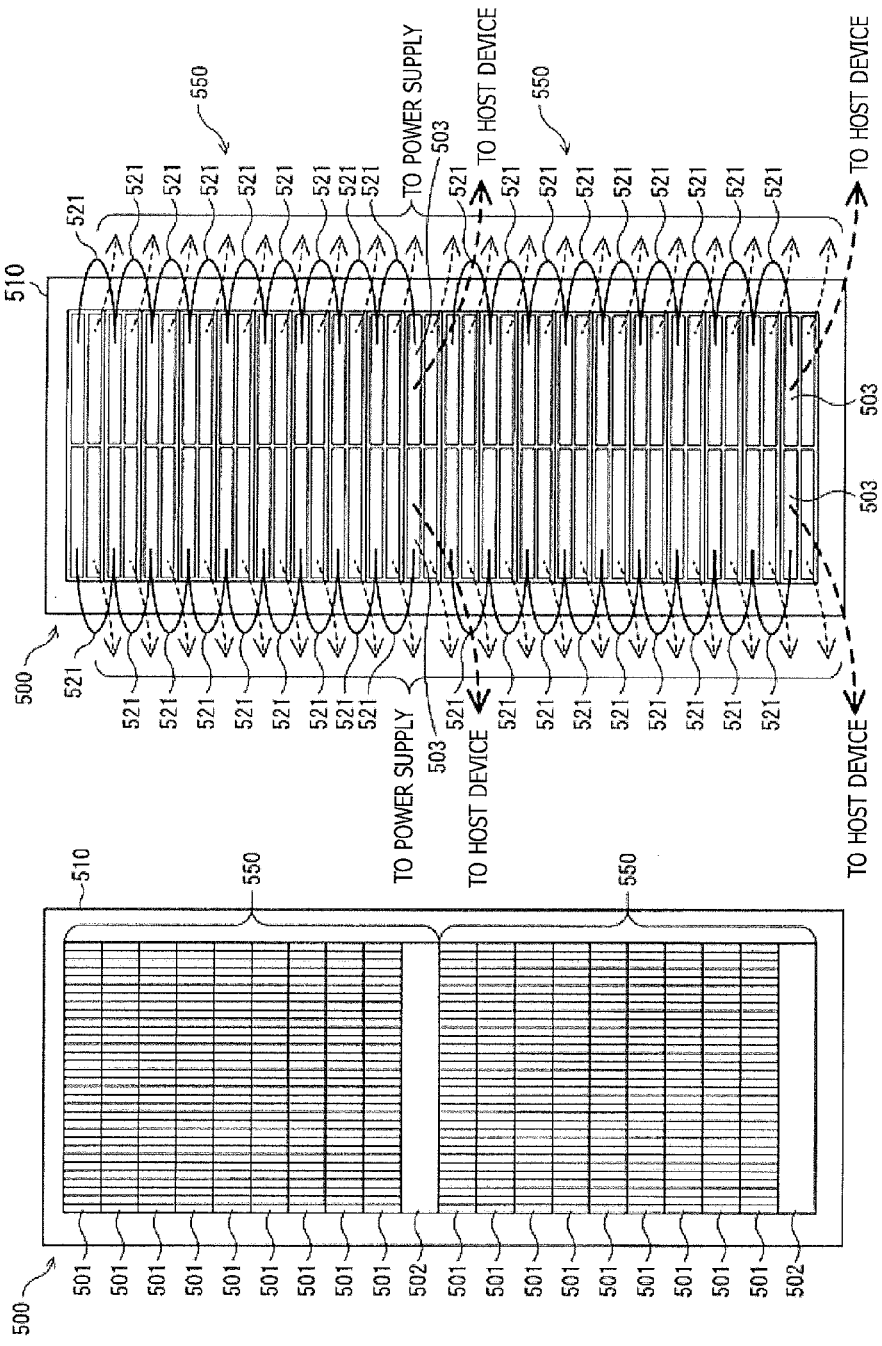
FIGS. 40A and 40B are views illustrating the appearance of a rack-mounted system according to the related art.

In addition, FIGS. 35 to 39 are views illustrating an operation of opening and closing the lid 401b by the cover structure 400A of an electronic device 1 as the example according to the embodiment. FIGS. 35 and 39 illustrate a state in which a plurality of electronic devices 1 are mounted in the rack 200 (open state), and FIGS. 36 and 37 illustrate a state in the middle of extracting a lower-side electronic device 1 from the rack 200 (in the middle of closing operation). In addition, FIG. 38 illustrates a state in the middle of inserting the lower-side electronic device 1 to the rack 200 (in the middle of opening operation).

Meanwhile, in the drawings, reference numerals, which are the same as the above-described reference numerals, indicate the same parts, and thus the detailed description thereof will not be repeated.

When the electronic device 1 is inserted into and extracted from the slot 210 of the rack 200, the cover structure 400A opens and closes the lid 401a provided at the aperture 11 and the lid 401b provided at the aperture 12.

The cover structure 400A includes the lids 401a and 401b and the hook sections 402a, 402b, 405a, and 405b, as illustrated in FIG. 26 and FIGS. 30 to 34.

The lid 401a is a plate member which is provided to cover the aperture 11, and is configured to freely slide along the front and back direction of the housing 10. The lid 401a is configured to be capable of moving to both the front side (refer to arrow 31 of FIG. 27) and to the back side (refer to arrow 32 in FIG. 27) around the aperture 11 as the center.

Further, the lid 401a is set to the open state by opening the aperture 11 in a state in which the lid 401a is at a position on the further front side than the aperture 11 or at a position on the further back side than the aperture 11, and is set to the closed state by shutting down the aperture 12 in a state in which the lid 401a is at a middle position in a movable range in the front and back direction.

The lid 401b is a plate member which is provided to cover the aperture 12, and is configured to freely slide along the front and back direction of the housing 10. The lid 401b is configured to be capable of moving to both the front side (refer to arrow 31 of FIG. 28) and to the back side (refer to arrow 32 in FIG. 28) around the aperture 12 as the center.

Further, the lid 401b is set to the open state by opening the aperture 12 in a state in which the lid 401b is at a position on the further front side than the aperture 11 or at a position on the further back side than the aperture 11, and is set to the closed state by shutting down the aperture 12 in a state in which the lid 401*b* is at a middle position in a movable range in the front and back direction.

Hereinafter, there is a case in which a state in which the lid 401*a* shuts down the aperture 11 is called that the lid 401*a* is at a shutdown position, and there is a case in which a state in which the lid 401*a* is at the front-side position or the back-side position and opens the aperture 11, is called that the lid 401*a* is at an open position.

In addition, there is a case in which a state in which the lid 401*b* shuts down the aperture 12 is called that the lid 401*b* is at the shutdown position, and there is a case in which a state in which the lid 401*b* is at the front-side position or the back-side position and opens the aperture 12, is called that the lid 401*b* is at the open position.

In addition, the lids 401*a* and 401*b* are respectively energized such that the apertures 11 and 12 are shut down by the shutdown mechanism 450A.

As illustrated in FIGS. 27 and 28, the shutdown mechanism 450A includes springs 4013-1 and 4013-2, and respectively energizes the lids 401*a* and 401*b* in directions in which the lids 401*a* and 401*b* are set to the closed state by the springs 4013-1 and 4013-2.

For example, as illustrated in FIG. 27, the spring 4013-1 is provided to connect the first attachment section 4011, which protrudes to the lower side of the lid 401*a* in the vicinities of both end parts in the left and right direction, to a second attachment section 4012-1 which protrudes from the top plate 112 in the vicinity of each of the inner wall surfaces 111 in the left and right direction in the housing 10 in the front-side position rather than the aperture 11, and energizes the lid 401*a* in a direction in which the lid 401*a* is drawn to the front side (refer to arrow 31).

In contrast, the spring 4013-2 is provided to connect the first attachment section 4011, which protrudes to the lower side of the lid 401*a* in the vicinities of both end parts in the left and right direction, to a second attachment section 4012-2 which protrudes from the top plate 112 in the vicinity of each of the inner wall surfaces 111 in the left and right direction in the housing 10 in the back-side position rather than the aperture 11, and energizes the lid 401*a* in a direction in which the lid 401*a* is drawn to the back side (refer to arrow 32).

The respective tensions of the spring 4013-1 and spring 4013-2 are adjusted such that the lid 401*a* is balanced and stops at a position where the aperture 11 is shut down.

Similarly, as illustrated in FIG. 28, the spring 4013-1 is provided to connect the first attachment section 4011, which protrudes to the upper side of the lid 401*b* in the vicinities of both end parts in the left and right direction, to a second attachment section 4012-1 which protrudes from the bottom plate 113 in the vicinity of each of the inner wall surfaces 111 in the left and right direction in the housing 10 in the front-side position rather than the aperture 12, and energizes the lid 401*b* in a direction in which the lid 401*b* is drawn to the front side (refer to arrow 31).

In contrast, the spring 4013-2 is provided to connect the first attachment section 4011, which protrudes to the upper side of the lid 401*b* in the vicinities of both end parts in the left and right direction, to a second attachment section 4012-2 which protrudes from the bottom plate 113 in the vicinity of each of the inner wall surfaces 111 in the left and right direction in the housing 10 in the back-side position rather than the aperture 12, and energizes the lid 401*b* in a direction in which the lid 401*b* is drawn to the back side (refer to arrow 32).

The respective tensions of the spring 4013-1 and spring 4013-2 are adjusted such that the lid 401*b* is balanced and stops at a position where the aperture 12 is shut down.

In addition, as illustrated in FIG. 26, the lid holes (first engagement section) 403*a* and 404*a* are formed in the lid 401*a*, and the lid holes (first engagement section) 403*b* and 404*b* are formed in the lid 401*b*, respectively.

In a state in which the electronic device 1 is inserted into the slot 210 of the rack 200, the hook section 402*b* (which will be described later) of another adjacent electronic device 1, which is inserted into the upper-side slot 210 of the slot 210, is engaged with the lid hole 403*a* in the rack 200.

In a state in which the electronic device 1 is inserted into the slot 210 of the rack 200, the hook section 405*b* (which will be described later) of another adjacent electronic device 1, which is inserted into the upper-side slot 210 of the slot 210, is engaged with the lid hole 404*a* in the rack 200.

Here, the lid hole 403*a* is formed on the front side in the lid 401*a*, and the lid hole 404*a* is formed on the back side in the lid 401*a*.

In addition, in a state in which the electronic device 1 is inserted into the slot 210 of the rack 200, the hook section 402*a* (which will be described later) of another adjacent electronic device 1, which is inserted into the lower-side slot 210 of the slot 210, is engaged with the lid hole 403*b* in the rack 200.

In addition, in a state in which the electronic device 1 is inserted into the slot 210 of the rack 200, the hook section 405*a* (which will be described later) of another adjacent electronic device 1, which is inserted into the lower-side slot 210 of the slot 210, is engaged with the lid hole 404*b* in the rack 200.

Here, the lid hole 404*b* is formed on the front side in the lid 401*b*, and the lid hole 403*b* is formed on the back side in the lid 401*b*.

In the top plate 112 of the housing 10, the hook section (second engagement section) 402*a* protrudes to the upper side on the front side rather than the aperture 11, and the hook section (second engagement section) 405*a* protrudes to the upper side on the back side rather than the aperture 11.

In addition, in the bottom plate 113 of the housing 10, the hook section (second engagement section) 402*b* protrudes to the lower side on the back side rather than the aperture 12, and the hook section (second engagement section) 405*b* protrudes to the lower side on the front side rather than the aperture 12.

The hook sections (second engagement section) 405*a* and 405*b* have the same configuration as the hook section 402*a*. That is, as illustrated in FIG. 23, the hook section 405*a* has a mountain shape which includes respective inclined surfaces in the front and back direction of the housing 10, and protrudes from the hole 1121, which is formed in the top plate 112 of the housing 10, toward the outside of the housing 10 to be freely drawn and inserted.

In addition, as illustrated in FIG. 23, the hook section 405*b* has a mountain shape which includes respective inclined surfaces in the front and back direction of the housing 10, and protrudes from the hole 1131, which is formed in the bottom plate 113 of the housing 10, toward the outside of the housing 10 to be freely drawn and inserted.

Meanwhile, similarly to the hook sections 402*a* and 402*b*, the hook sections 405*a* and 405*b* are not limited to the flat springs and various modifications are possible. For example, a member which is formed in a mountain shape may be caused to protrude from the holes 1121 and 1131 to be freely drawn and inserted by an elastic member such as spring.

In addition, as illustrated in FIG. 29, the hook sections 402a, 402b, 405a, and 405b are arranged at positions which are deviated from each other in the left and right direction of the housing 10. In an example illustrated in FIG. 29, the hook sections 402a and 405a are arranged at a position which is deviated to the left side from the center of the housing 10, and the hook sections 402b and 405b are arranged at positions which are deviated to the right side from the center of the housing 10.

Further, the hook section 402a and the hook section 405a are arranged at positions which are deviated in the left and right direction, and the hook section 402b and the hook section 405b are arranged at positions which are deviated in the left and right direction.

As described above, the hook section 405a is engaged with the lid hole 404b of the lid 401b, and the hook section 405b is engaged with the lid hole 404a of the lid 401a.

Accordingly, the lid hole 404b is formed at a position corresponding to the hook section 405a, and is formed at the same position in the left and right direction. Similarly, the lid hole 404a is formed at a position corresponding to the hook section 405b, and is formed at the same position in the left and right direction. Therefore, the lid hole 404a and the lid hole 404b are arranged at positions which are deviated in the left and right direction of the housing 10.

An operation of opening and closing the lids 401a and 401b performed by the cover structure 400A of the electronic device 1, which is configured as described above, as the example according to the embodiment will be described with reference to FIGS. 30 to 39.

Meanwhile, for convenience, FIGS. 30 to 39 illustrate the hook sections 402a, 402b, 405a, and 405b, which are arranged at the positions deviated in the left and right direction of the housing 10, as described above.

First, the operation of opening and closing the lid 401a performed by the cover structure 400A of the electronic device 1 as the example according to the embodiment will be described with reference to FIGS. 30 to 34. Hereinafter, an example in which electronic devices 1-1 and 1-2 are inserted into the slots 210 of the rack 200 and in which an operation of exchanging the electronic device 1-1 arranged on the lower side is performed will be described.

Meanwhile, for convenience, in FIGS. 30 to 34, some parts of configuration related to the opening and closing the lid 401b are not illustrated in the drawings.

That is, as illustrated in FIG. 30, the electronic devices 1-1 and 1-2 are inserted into the slots 210 of the rack 200, and the electronic device 1-2 is arranged on the upper side of the electronic device 1-1.

In a state illustrated in FIG. 30, the lid 401a is moved to the back side in a state in which the hook section 402b of the electronic device 1-2 is engaged with the lid hole 403a of the lid 401a of the electronic device 1-1, and thus the aperture 11 is at the open state. Therefore, in the electronic device 1-1, the contact clamp 31 of the first connector 30 protrudes to the outside of the housing 10. In addition, the lid 401b of the electronic device 1-2 is at an open position, and the aperture 12 is at the open state.

Accordingly, connector connection is performed between the second connector 40 of the electronic device 1-2 and the first connector 30 of the electronic device 1-1 through the apertures 11 and 12.

The operator extracts the electronic device 1-1 from the slot 210 of the rack 200 (refer to arrow L) from the state illustrated in FIG. 30. Therefore, as illustrated in FIG. 31, the hook section 402b of the electronic device 1-2 comes into contact with the housing 10 of the electronic device 1-1, and in pushed into the housing 10 of the electronic device 1-2. Therefore, the engagement of the hook section 402b of the electronic device 1-2 with the lid hole 403a of the electronic device 1-1 is released, and thus the lid 401a of the electronic device 1-1 is drawn to the front side by the spring 4013-1 of the shutdown mechanism 450A and moves to a position which comes into contact with the hook section 405b of the electronic device 1-2.

When the operator further extracts the electronic device 1-1 from the slot 210 of the rack 200 (refer to arrow L) from a state illustrated in FIG. 31, the state illustrated in FIG. 32 is acquired. That is, the hook section 405b of the electronic device 1-2 also comes into contact with the housing 10 of the electronic device 1-1 and is pushed into the housing 10 of the electronic device 1-2. Therefore, the lid 401a of the electronic device 1-1 is capable of freely move, and the lid 401a is pulled back to a position, which covers the aperture 11, by the springs 4013-1 and 4013-2 of the shutdown mechanism 450A which are attached to the front and back sides of the lid. That is, as illustrated in FIG. 32, the aperture 11 is set to a closed state.

Thereafter, the electronic device 1-1 is extracted from the rack 200, and the electronic device 1-1 is inserted into the position again.

Meanwhile, the state illustrated in FIG. 32 is a state in which the electronic device 1-2 is mounted in the rack 200 and the electronic device 1-1 is inserted halfway into the lower-side slot 210. Here, when the operator further pushes the electronic device 1-1 (refer to the direction of arrow K) from the state illustrated in FIG. 32, a state illustrated in FIG. 33 is acquired.

In a state illustrated in FIG. 33, the hook section 405b of the electronic device 1-2 is engaged with the lid hole 404a of the lid 401a of the electronic device 1-1. That is, the lid 401a is at a state which is fixed by the hook section 405b of the electronic device 1-2.

When the electronic device 1-1 is further inserted into the rack 200 (refer to the direction of arrow K) from the above state, the lid 401a in the electronic device 1-1 relatively moves to the front side in accordance that the electronic device 1-1 moves to the back side.

Further, the electronic device 1-1 is inserted into the rack 200 (refer to the direction of arrow K), and the electronic device 1-1 moves to a prescribed position in the rack 200, as illustrated in FIG. 34.

In the movement process, the hook section 405b of the electronic device 1-2 is engaged with the lid hole 404a of the lid 401a of the electronic device 1-1, with the result that the lid 401a continuously moves to the front side in the electronic device 1-1, and thus the aperture 11 is open as illustrated in FIG. 34.

In a state illustrated in FIG. 34, the lid 401a is at an open position in the electronic device 1-1, and thus the contact clamp 31 of the first connector 30 protrudes to the outside of the housing 10 in the electronic device 1-1. In addition, the lid 401b of the electronic device 1-2 is also at the open position, and the aperture 12 is at the open state.

Accordingly, connector connection is performed between the second connector 40 of the electronic device 1-2 and the first connector 30 of the electronic device 1-1 through the apertures 11 and 12.

Subsequently, an operation of opening and closing the lid 401b by the cover structure 400A of an electronic device 1 as the example according to the embodiment will be described with reference to FIGS. 35 to 39.

The operation of opening and closing the lid 401b is simultaneously performed with the above-described operation of opening and closing the lid 401*a*. Hereinafter, an example in which electronic devices 1-1 and 1-2 are inserted into the slots 210 of the rack 200 and in which an operation of exchanging the electronic device 1-1 arranged on the lower side is performed will be described.

Meanwhile, for convenience, in FIGS. 35 to 39, some parts of configuration related to the opening and closing the lid 401*a* are not illustrated in the drawings.

That is, as illustrated in FIG. 35, the electronic devices 1-1 and 1-2 are inserted into the slots 210 of the rack 200, and the electronic device 1-2 is arranged on the upper side of the electronic device 1-1.

In a state illustrated in FIG. 35, the lid 401*b* is moved to the front side in a state in which the hook section 402*a* of the electronic device 1-1 is engaged with the lid hole 403*b* of the lid 401*b* of the electronic device 1-2, and thus the aperture 12 is at the open state. Therefore, in the electronic device 1-2, the contact clamp 41 of the second connector 40 is exposed from the aperture 12. In addition, the lid 401*a* of the electronic device 1-1 is also at the open, and the aperture 11 is at the open state.

Accordingly, connector connection is performed between the second connector 40 of the electronic device 1-2 and the first connector 30 of the electronic device 1-1 through the apertures 11 and 12.

The operator extracts the electronic device 1-1 from the slot 210 of the rack 200 (refer to arrow L) from the state illustrated in FIG. 35. Therefore, as illustrated in FIG. 36, the hook section 402*a* of the electronic device 1-1 comes into contact with the housing 10 of the electronic device 1-2 and is pushed into the housing 10 of the electronic device 1-1. Therefore, the engagement of the hook section 402*a* of the electronic device 1-1 with the lid hole 403*b* of the electronic device 1-2 is released, and thus the lid 401*b* of the electronic device 1-2 is drawn to the back side by the spring 4013-2 of the shutdown mechanism 450A and moves to a position which comes into contact with the hook section 405*a* of the electronic device 1-1.

When the operator further extracts the electronic device 1-1 from the slot 210 of the rack 200 (refer to arrow L) from a state illustrated in FIG. 36, the state illustrated in FIG. 37 is acquired. That is, the hook section 405*a* of the electronic device 1-1 also comes into contact with the housing 10 of the electronic device 1-2 and is pushed into the housing 10 of the electronic device 1-1. Therefore, the lid 401*b* of the electronic device 1-2 is capable of freely move, and the lid 401*b* is pulled back to a position, which covers the aperture 12, by the springs 4013-1 and 4013-2 of the shutdown mechanism 450A which are attached to the front and back sides of the lid 401*b*. That is, as illustrated in FIG. 37, the aperture 12 is set to the closed state.

Thereafter, the electronic device 1-1 is extracted from the rack 200, and the electronic device 1-1 is inserted into the position again.

Meanwhile, the state illustrated in FIG. 37 is a state in which the electronic device 1-2 is mounted in the rack 200 and the electronic device 1-1 is inserted halfway into the lower-side slot 210. Here, when the operator further pushes the electronic device 1-1 (refer to the direction of arrow K) from the state illustrated in FIG. 37, a state illustrated in FIG. 38 is acquired.

In a state illustrated in FIG. 38, the hook section 405*a* of the electronic device 1-1 is engaged with the lid hole 404*b* of the lid 401*b* of the electronic device 1-2. That is, the lid 401*b* is at a state which is fixed by the hook section 405*a* of the electronic device 1-1.

When the electronic device 1-1 is further inserted into the rack 200 (refer to the direction of arrow K) from the above state, the lid 401*b* in the electronic device 1-2 relatively moves to the back side in accordance that the electronic device 1-1 moves to the back side.

Further, the electronic device 1-1 is inserted into the rack 200 (refer to the direction of arrow K), and the electronic device 1-1 moves to a prescribed position in the rack 200, as illustrated in FIG. 39.

In the movement process, the hook section 405*a* of the electronic device 1-1 is engaged with the lid hole 404*b* of the lid 401*b* of the electronic device 1-2, with the result that the lid 401*b* continuously moves to the back side in the electronic device 1-2, and thus the aperture 12 is open as illustrated in FIG. 39.

In a state illustrated in FIG. 39, the lid 401*b* is at an open position in the electronic device 1-2, and thus the contact clamp 41 of the second connector 40 is exposed from the aperture 12 in the electronic device 1-2. In addition, the lid 401*a* of the electronic device 1-1 is also at the open position, and the aperture 11 is at the open state.

Accordingly, connector connection is performed between the second connector 40 of the electronic device 1-2 and the first connector 30 of the electronic device 1-1 through apertures 11 and 12.

As described above, in the cover structure 400A which is configured as described above, when, in a state in which the electronic device 1-2 is inserted into the slot 210 of the rack 200, the electronic device 1-1 is inserted into and extracted from the lower-side slot 210, it is possible to open and close the apertures 11 and 12 in association that the electronic device 1-1 is inserted and extracted.

That is, when the electronic device 1-1 is inserted into and extracted from the lower-side slot 210 of the slot 210 to which the electronic device 1-2 is inserted in advance, the hook section 405*b* of the electronic device 1-2 is engaged with the lid hole 404*a* of the lid 401*a* of the electronic device 1-1, and the hook section 405*a* of the electronic device 1-1 is engaged with the lid hole 404*b* of the lid 401*b* of the electronic device 1-2.

When the operator further pushes the electronic device 1-1 to the slot 210 of the rack 200 in the state in which the engagement is performed, the lids 401*a* and 401*b* are respectively arranged at open positions, and thus both the apertures 11 and 12 are open.

Therefore, it is possible to securely perform connector connection between different electronic devices 1 in the upper and lower slots 210 in the rack 200.

In addition, when the electronic device 1-1, which is inserted into the lower-side slot 210, is extracted in a state in which the electronic devices 1-2 and 1-1 are inserted into the rack 200, the hook sections 402*b* and 405*b* of the electronic device 1-2 are pushed into the housing 10 of the electronic device 1-2 and the hook sections 402*a* and 405*a* of the electronic device 1-1 are pushed into the housing 10 of the electronic device 1-1, respectively. Therefore, the lids 401*a* and 401*b* respectively shut down the apertures 11 and 12 by the shutdown mechanism 450A. Therefore, in a state in which the electronic devices 1-1 and 1-2 are detached from the rack 200, it is possible to secure the first connectors 30 and the second connectors 40.

When the inner side surfaces of the lids 401*a* and 401*b* come into contact with the contact clamps of the first connectors 30 and the second connectors 40, the contact clamps in the first connectors 30 and the second connectors 40 are short-circuited, and thus there is a problem in that troubles occur. In such a case, the troubles may be dealt with by attaching insulation sheets to the inner side surfaces of the lids 401*a* and 401*b* or by manufacturing the lids 401*a* and 401*b* by insulation materials.

The technology disclosed herein is not limited to the above-described embodiment and various modifications are possible without departing from the gist of the embodiment. Each configuration and each process of the embodiment may be selected or may be appropriately combined.

For example, in the above-described embodiment, the first connectors 30 are arranged at two places of the MP 20 and the second connectors 40 are arranged at two places of the MP 20. However, the embodiment is not limited thereto. That is, one or three or more first connectors 30 may be arranged on the upper side of the MP 20 and one or three or more second connectors 40 may be arranged on the lower side of the MP 20.

In addition, in the above-described embodiment, the first connectors 30 and the second connectors 40 are installed in the MP 20. However, the embodiment is not limited thereto, and the first connectors 30 and the second connectors 40 may be arranged in a section other than the MP 20.

Further, in the example illustrated in FIG. 11, the position-determining protrusion clamp 151 and the position determining recessed clamp 152 are installed in the MP 20. However, the embodiment is not limited thereto, and the position-determining protrusion clamp 151 and the position determining recessed clamp 152 may be arranged in a section other than the MP 20.

In addition, the above-described embodiment describes the example in which the electronic devices 1 are vertically arranged and inserted into the rack 200 and connector connection is performed between the vertically arranged electronic devices 1. However, the embodiment is not limited thereto. That is, the electronic devices 1 may be arranged in the left and right direction and inserted into the rack 200 and connector connection may be performed between the electronic devices 1 which are arranged in the left and right direction. Further, various modifications are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A rack-mounted electronic device, which is mounted in a rack, comprising:
   a housing;
   a first aperture formed on a first surface of the housing;
   a first connector configured to protrude from the first aperture;
   a second aperture formed on a second surface which faces the first surface in the housing;
   a second connector arranged in the second aperture;
   a first cover section configured to be capable of shutting down the first aperture;
   a second cover section configured to be capable of shutting down the second aperture;
   a first opening and closing mechanism configured to open and close the first aperture using the first cover section; and
   a second opening and closing mechanism configured to open and close the second aperture using the second cover section.

2. The device according to claim 1, wherein the first opening and closing mechanism and the second opening and closing mechanism are configured to respectively open and close the first aperture and the second aperture in association with the attachment and separation of the electronic device to and from the rack.

3. The device according to claim 2, wherein the first opening and closing mechanism and the second opening and closing mechanism include:
   a movement member configured to move in accordance that the electronic device is fixed to or released from the rack; and
   a link mechanism configured to open or shut down the first aperture and the second aperture using the first cover section and the second cover section according to movement of the movement member.

4. The device according to claim 3, wherein the first surface or the second surface is perpendicular to an arrangement direction of a plurality of electronic devices which are attached to the rack.

5. The device according to claim 3, wherein the first connector is arranged on a first side of a circuit board which is arranged in the housing, and the second connector is arranged on a second side which faces the first side of the circuit board.

6. The device according to claim 2, wherein the first opening and closing mechanism and the second opening and closing mechanism further include:
   a first engagement section formed in the first cover section and the second cover section; and
   a second engagement section formed in the housing and engaged with the first engagement section in the housing, and
   wherein the first opening and closing mechanism and the second opening and closing mechanism set the first aperture and the second aperture to an open state by causing the first engagement section to be engaged with the second engagement section and causing the first cover section and the second cover section to move when the electronic device is attached to the rack.

7. The device according to claim 6, wherein the first surface or the second surface is perpendicular to an arrangement direction of a plurality of electronic devices which are attached to the rack.

8. The device according to claim 6, wherein the first connector is arranged on a first side of a circuit board which is arranged in the housing, and the second connector is arranged on a second side which faces the first side of the circuit board.

9. The device according to claim 2, wherein the first surface or the second surface is perpendicular to an arrangement direction of a plurality of electronic devices which are attached to the rack.

10. The device according to claim 2, wherein the first connector is arranged on a first side of a circuit board which is arranged in the housing, and the second connector is arranged on a second side which faces the first side of the circuit board.

11. The device according to claim 1, wherein the first surface or the second surface is perpendicular to an arrangement direction of a plurality of electronic devices which are attached to the rack.

12. The device according to claim 11, wherein the first connector is arranged on a first side of a circuit board which is arranged in the housing, and the second connector is arranged on a second side which faces the first side of the circuit board.

13. The device according to claim 1, wherein the first surface or the second surface is perpendicular to an arrangement direction of a plurality of electronic devices which are attached to the rack.

14. The device according to claim 1, wherein the first connector is arranged on a first side of a circuit board which is arranged in the housing, and the second connector is arranged on a second side which faces the first side of the circuit board.

15. The device according to claim 1, wherein the first connector is arranged on a first side of a circuit board which is arranged in the housing, and the second connector is arranged on a second side which faces the first side of the circuit board.

* * * * *